US012812913B2

(12) United States Patent
Chen et al.

(10) Patent No.: US 12,812,913 B2
(45) Date of Patent: Nov. 24, 2026

(54) SPACER STRUCTURES FOR NANO-SHEET-BASED DEVICES

(71) Applicant: Taiwan Semiconductor Manufacturing Company, Ltd., Hsin-Chu (TW)

(72) Inventors: Shih-Cheng Chen, New Taipei City (TW); Kuo-Cheng Chiang, Hsinchu County (TW); Zhi-Chang Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/446,733

(22) Filed: Aug. 9, 2023

(65) Prior Publication Data

US 2023/0387243 A1 Nov. 30, 2023

Related U.S. Application Data

(62) Division of application No. 17/219,410, filed on Mar. 31, 2021, now Pat. No. 12,588,247.

(51) Int. Cl.
*H10D 30/67* (2025.01)
*H10D 30/01* (2025.01)
(Continued)

(52) U.S. Cl.
CPC ....... *H10D 30/6739* (2025.01); *H10D 30/031* (2025.01); *H10D 30/6713* (2025.01);
(Continued)

(58) Field of Classification Search
CPC ........... H01L 29/4908; H01L 21/02603; H01L 29/0673; H01L 29/42392; H01L 29/4983;
(Continued)

(56) References Cited

U.S. PATENT DOCUMENTS 8,796,666 B1 8/2014 Huang et al.
8,822,243 B2 9/2014 Yan et al.
(Continued)

*Primary Examiner* — Norman D Richards
*Assistant Examiner* — Sean Ayers Winters
(74) *Attorney, Agent, or Firm* — HAYNES AND BOONE, LLP

(57) ABSTRACT

A semiconductor device includes a substrate, a first source/drain feature and a second source/drain feature over the substrate, a first semiconductor layer and a second semiconductor layer between the first and the second source/drain features, and a gate between the first and the second source/drain features. A portion of the gate is further between the first and the second semiconductor layers. Moreover, the semiconductor device includes a first inner spacer and a second inner spacer. The first inner spacer is between the first and the second semiconductor layers and further between the portion of the gate and a portion of the first source/drain feature. Furthermore, the portion of the first source/drain feature is between the first semiconductor layer and the second semiconductor layer. The first inner spacer has a U-shaped profile. Additionally, the second inner spacer is between the first inner spacer and the portion of the first source drain feature.

20 Claims, 24 Drawing Sheets

(51) Int. Cl.

| | |
|---|---|
| ***H10D 62/00*** | (2026.01) |
| ***H10D 62/10*** | (2025.01) |
| ***H10D 64/01*** | (2025.01) |
| ***H10D 64/66*** | (2025.01) |
| ***H10P 14/20*** | (2026.01) |

(52) U.S. Cl.

CPC ..... *H10D 30/6735* (2025.01); *H10D 30/6757* (2025.01); *H10D 62/021* (2025.01); *H10D 62/121* (2025.01); *H10D 64/018* (2025.01); *H10D 64/671* (2025.01); *H10P 14/3462* (2026.01)

(58) Field of Classification Search

CPC ......... H01L 29/66553; H01L 29/66636; H01L 29/66742; H01L 29/78618; H01L 29/78696; H10D 30/6739; H10D 64/671; H10D 30/6757; H10D 62/121; H10D 64/018; H10D 62/021; H10D 30/6713; H10D 30/6735; H10D 30/031; H10P 14/3462

See application file for complete search history.

(56) References Cited

U.S. PATENT DOCUMENTS

| | | | | |
|---|---|---|---|---|
| 8,987,142 | B2 | 3/2015 | Lee et al. | |
| 9,053,279 | B2 | 6/2015 | Chang et al. | |
| 9,093,530 | B2 | 7/2015 | Huang et al. | |
| 9,099,530 | B2 | 8/2015 | Lin et al. | |
| 9,153,478 | B2 | 10/2015 | Liu et al. | |
| 9,501,601 | B2 | 11/2016 | Chang et al. | |
| 9,548,303 | B2 | 1/2017 | Lee et al. | |
| 9,876,114 | B2 | 1/2018 | Huang | |
| 2013/0288468 | A1 | 10/2013 | Chi | |
| 2017/0005176 | A1* | 1/2017 | Sung | H10D 62/121 |
| 2018/0294331 | A1* | 10/2018 | Cho | H01L 29/0649 |
| 2019/0157420 | A1* | 5/2019 | Cheng | H01L 29/0673 |
| 2019/0305104 | A1* | 10/2019 | Xie | H10D 62/121 |
| 2020/0013673 | A1 | 1/2020 | Zierath et al. | |
| 2020/0052086 | A1* | 2/2020 | Yang | H01L 29/4991 |
| 2020/0066725 | A1* | 2/2020 | Bhuwalka | H10D 30/611 |
| 2020/0312981 | A1* | 10/2020 | Bomberger | H01L 21/0245 |
| 2020/0365733 | A1* | 11/2020 | Song | H01L 29/0847 |
| 2020/0381547 | A1* | 12/2020 | Song | H01L 29/78696 |
| 2021/0028173 | A1* | 1/2021 | Yang | B82Y 10/00 |

* cited by examiner

SPACER STRUCTURES FOR NANO-SHEET-BASED DEVICES

This is a divisional application of U.S. patent application Ser. No. 17/219,410, filed Mar. 31, 2021, the entire disclosure of which is incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

For example, nano-sheet-based devices have been introduced in an effort to improve gate control by increasing gate-channel coupling, reducing OFF-state current, and reducing short-channel effects (SCEs). Nano-sheet-based devices include a stack of suspended channel layers at least partially surrounded by a gate structure. The nano-sheet-based devices are compatible with conventional complementary metal-oxide-semiconductor (CMOS) processes, allowing them to be aggressively scaled down while maintaining gate control and mitigating SCEs. However, as nano-sheet-based devices continue to scale, challenges have arisen in reliably fabricating inner spacer structures, which separate the gate structure from source/drain features of the nano-sheet-based devices. These challenges have been observed to degrade the device performance and increase the processing complexity. Therefore, although existing nano-sheet-based devices and methods of fabricating such have been generally adequate for their intended purposes, they are not satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
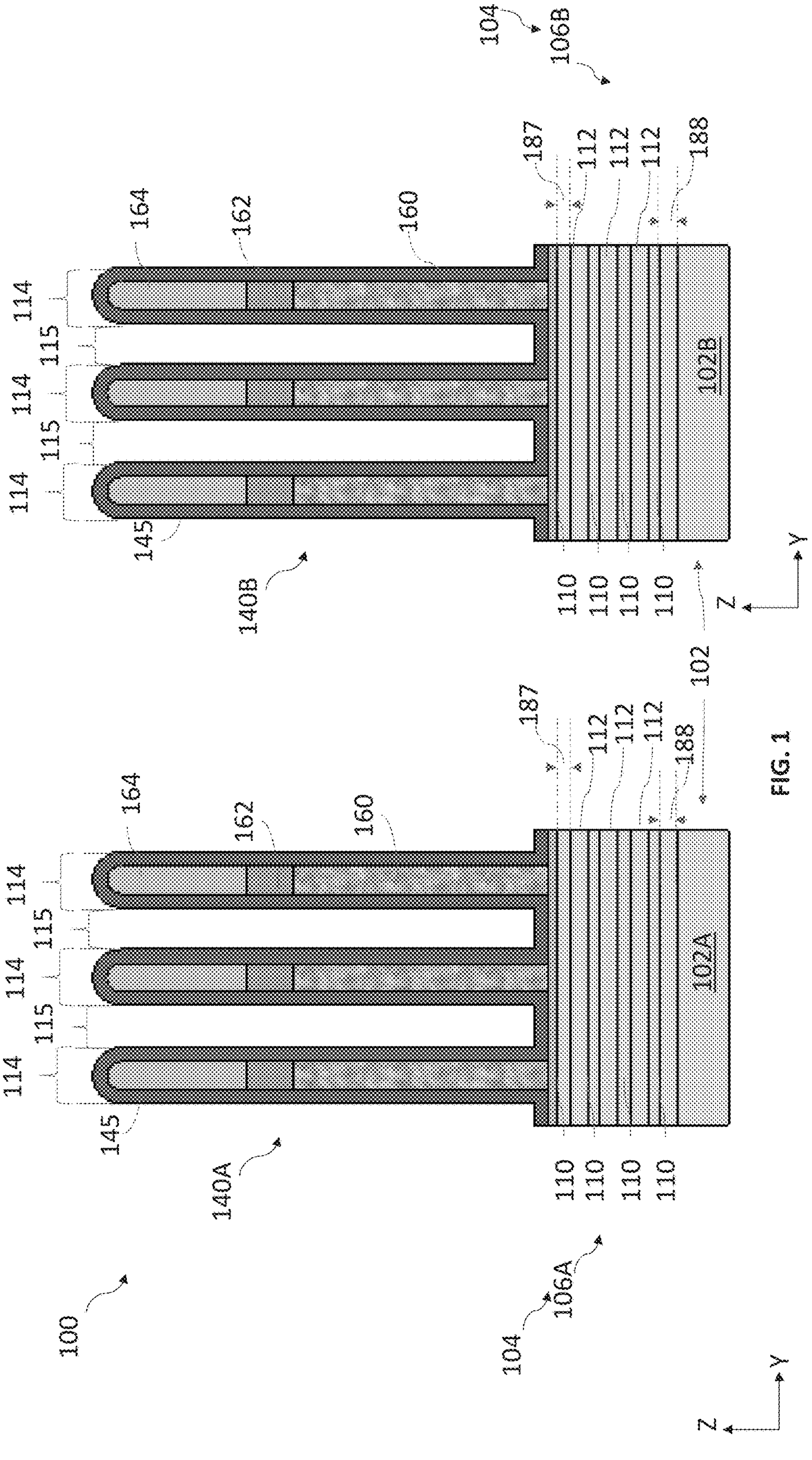
FIGS. 1-5 and FIGS. 8-20 are fragmentary diagrammatic views of a nano-sheet-based device, in portion or entirety, at various fabrication stages according to various aspects of the present disclosure.

The present disclosure relates generally to integrated circuit devices, and more particularly, to nano-sheet-based devices.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature on, connected to, and/or coupled to another feature in the present disclosure may induce embodiments in which the features are formed in direct contact, and may also include embodiments in which additional features may be formed interposing the features, such that the features may not be in direct contact.

Further, spatially relative terms, for example, “lower,” “upper,” “horizontal,” “vertical,” “above,” “over,” “below,” “beneath,” “up.” “down,” “top,” “bottom,” etc. as well as derivatives thereof (e.g., “horizontally,” “downwardly,” “upwardly,” etc.) are used herein for ease of description to describe one element or feature’s relationship to another element(s) or feature(s). The spatially relative terms are intended to encompass different orientations than as depicted of a device (or system or apparatus) including the elements) or feature(s), including orientations associated with the device’s use or operation. The apparatus may he otherwise oriented (rotated 90 degrees or at other orientations) and the spatially relative descriptors used herein may likewise be interpreted accordingly.

The present disclosure is generally related to ICs and semiconductor devices and methods of forming the same. More particularly, the present disclosure is related to nano-sheet-based devices. A nano-sheet-based device includes any device that has a stack of suspended channel layers and, in some embodiments, only one suspended channel layer) that are at least partially surrounded by a gate structure. Nano-sheet-based devices include gate-all-around (GAA) devices, multi-bridge-channel (MBC) devices, multi-gate devices, and other similar devices. Furthermore, the nano-sheet-based devices may include channel layers of any suitable shapes and/or configurations. For example, the channel layers may be in one of many different shapes, such as wire (or nanowire), sheet (or nanosheet), bar (or nano-bar), and/or other suitable shapes. in other words, the term nano-sheet-based devices broadly encompasses devices having channel layers in nanowire, nano-bars, and any other suitable shapes. The nano-sheet based devices presented herein may be a complementary metal-oxide-semiconductor (CMOS) device, a p-type metal-oxide-semiconductor (pMOS) device, or an n-type metal-oxide-semiconductor (nMOS) device. Further, the channel layers of the nano-sheet-based devices may engage with a single, contiguous gate structure, or multiple gate structures. One of ordinary skill may recognize other examples of semiconductor devices that may benefit from aspects of the present disclosure. For example, other types of metal-oxide semiconductor field effect transistors (MOSFETs), such as planar MOSFETs, FinFETs, or other multi-gate FETs may benefit from the present disclosure.

FIGS. 1-5 and FIGS. 8-20 are fragmentary diagrammatic views of a nano-sheet-based device 100 (interchangeably referred to as the device 100), in portion or entirety, at various fabrication stages according to various aspects of the present disclosure. In particular, FIGS. 1-5 and FIGS. 8-20 are cross-sectional views of the device 100 in a Y-Z plane. In that regard, X-direction, Y-direction, and Z-direction are directions perpendicular to each other. The X-direction and Y-directions define an K-Y plane. In the depicted embodiments, the device 100 has a substrate that, has a top surface extending along an X-Y plane. The Y-direction and the Z-direction define a Y-Z plane perpendicular to the X-Y plane; and the X-direction and the Z-direction define an X-Z plane perpendicular to the X-Y plane and to the Y-Z plane.

Device 100 may be included in a microprocessor, a memory, and/or other IC device. In some embodiments, device 100 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (RITs), laterally diffused MOS (LDMOS) transistors, high voltage transistors, high frequency transistors, other suitable components, or combinations thereof. In some embodiments, device 100 is included in a non-volatile memory, such as a non-volatile random access memory (NVRAM), a flash memory, an electrically erasable programmable read only memory (EEPROM), an electrically programmable read-only memory (EPROM), other suitable memory type, or combinations thereof. FIGS. 1-5 and FIGS. 8-20 have been simplified for the sake of clarity to better understand the inventive concepts of the present disclosure. Additional features can be added in device 100, and some of the features described below can be replaced, modified, or eliminated in other embodiments of device 100.

Turning to FIG. 1, device 100 includes a substrate (wafer) 102. In the depicted embodiment, substrate 102 includes silicon. Alternatively—or additionally, substrate 102 includes another elementary semiconductor, such as germanium; a compound semiconductor, such as silicon carbide, gallium arsenide, gallium phosphide, indium phosphide, indium arsenide, and/or indium antimonids; an alloy semiconductor, such as silicon germanium (SiGe), GaAsP, AlGaAs, GaInAs, GaInP, and/or GaInAsP; or combinations thereof. Alternatively, substrate 102 is a semiconductor-on-insulator substrate, such as a silicon-on-insulator (SOI) substrate, a silicon germanium-on-insulator (SCAN) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions depending on design requirements of device 100. In the depicted embodiment, substrate 102 includes a p-type doped region 102A (referred to hereinafter as a p-well), which can be configured for n-type transistors (such as n-type nano-sheet-based transistors), and an n-type doped region 1029 (referred to hereinafter as an n-well), which can be configured for p-type transistors (such as p-type nano-sheet-based transistors). N-type doped regions, such as n-well 102B, are doped with n-type dopants, such as phosphorus, arsenic, other n-type dopant, or combinations thereof. P-type doped regions, such as p-well 102A, are doped with p-type dopants, such as boron, indium, other p-type dopant, or combinations thereof. In some implementations, substrate 102 includes doped regions formed with a combination of p-type dopants and n-type dopants. The various doped regions can be formed directly on and/or in substrate 102, for example, providing a p-well structure, an n-well structure, a dual-well structure. a raised structure, or combinations thereof. An ion implantation process, a diffusion process, and/or other suitable doping process can be performed to form the various doped regions.

A semiconductor layer stack 104 is formed over the p-well 102A in substrate 102; and a semiconductor layer stack 104 is formed over the n-well 102B in substrate 102. The semiconductor layer stacks 104 over the p-well 102A and the n-well 102B may be formed in the same or separate processing steps. The semiconductor layer stack 104 each includes semiconductor layers 110 and semiconductor layers 112 stacked vertically (e.g., along the Z-direction) in an interleaving or alternating configuration from a surface of the p-well 102A or the n-well 102B of the substrate 102. In some embodiments, semiconductor layers 110 and semiconductor layers 112 are epitaxially grown in the depicted interleaving and alternating configuration. For example, a first one of semiconductor layers 110 is epitaxially grown on substrate, a first one of semiconductor layers 112 is epitaxially grown on the first one of semiconductor layers 110, a second one of semiconductor layers 110 is epitaxially grown on the first one of semiconductor layers 112, and so on until semiconductor layer stack 108 has a desired number of semiconductor layers 110 and semiconductor layers 112. In such embodiments, semiconductor layers 110 and semiconductor layers 112 can be referred to as epitaxial layers. n some embodiments, epitaxial growth of semiconductor layers 110 and semiconductor layers 112 is achieved by a molecular beam epitaxy (MBE) process, a chemical vapor deposition (CM) process, a metalorganic chemical vapor deposition (MOCVD) process, other suitable epitaxial growth process, or combinations thereof. The semiconductor layers 110 and 112 may each include the same or different materials over the p-well 102A and the n-well 102B. Moreover, the semiconductor layer stacks 104 may include the same or different numbers of layers over the p-well 102A and the n-well 1029.

A composition of semiconductor layers 110 is different than a composition of semiconductor layers 112 to achieve etching selectivity and/or different oxidation rates during subsequent processing. In some embodiments, semiconductor layers 110 have a first etch rate to an etchant and semiconductor layers 112. have a second etch rate to the etchant, where the second etch rate is less than the first etch rate. In some embodiments, semiconductor layers 110 have a first oxidation rate and semiconductor layers 112 have a second oxidation rate, where the second oxidation rate is less than the first oxidation rate. In the depicted embodiment, semiconductor layers 110 and semiconductor layers 112 include different materials, constituent atomic percentages, constituent weight percentages, thicknesses, and/or characteristics to achieve desired etching selectivity during an etching process, such as an etching process implemented to form suspended channel layers in channel regions of device 100. For example, where semiconductor layers 110 include silicon germanium and semiconductor layers 112 include silicon, a silicon etch rate of semiconductor layers 112 is less than a silicon germanium etch rate of semiconductor layers 110. In some embodiments, semiconductor layers 110 and semiconductor layers 112 can include the same material but with different constituent atomic percentages to achieve the etching selectivity and/or different oxidation rates. For example, semiconductor layers 110 and semiconductor layers 112 can include silicon germanium, where semiconductor layers 110 have a first silicon atomic percent and/or a first germanium atomic percent and semiconductor layers 112 have a second, different silicon atomic percent and/or a second, different germanium atomic percent. The present disclosure contemplates that semiconductor layers 110 and semiconductor layers 112 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 112 or portions thereof form channel regions of device 100. In the depicted embodiment, semiconductor layer stack 104 includes four semiconductor layers 110 and four semiconductor layers 112 configured to form four semiconductor layer pairs disposed over substrate 102, each semiconductor layer pair having a respective first semiconductor layer 110 and a respective second semiconductor layer 112. After undergoing subsequent processing, such configuration will result in device 100 having four channels. However, the present disclosure contemplates embodiments where semiconductor layer stack 104 includes more or less semiconductor layers, for example, depending on a number of channels desired for device 100 (e.g., a nano-sheet-based transistor) and/or design requirements of device 100. For example, semiconductor layer stack 104 can include two to ten semiconductor layers 110 and two to ten semiconductor layers 112. In furtherance of the depicted embodiment, semiconductor layers 110 have a thickness 187 and semiconductor layers 112 have a thickness 188, where thickness 187 and thickness 188 are chosen based on fabrication and/or device performance considerations for device 100. For example, thickness 187 can be configured to achieve desired thickness of channels of device 100, and thickness 188 can be configured to define a desired distance (or gap) between adjacent channels of device 100 (e.g., between semiconductor layers 112). Both thickness 187 and thickness 188 can be configured to achieve desired performance of device 100. Furthermore, as described later, thickness 188 may be engineered to achieve certain desired device characteristics. In some embodiments, thickness 187 and thickness 188 are each about 1 nm to about 10 nm.

The semiconductor layer stacks 104 are patterned to form a fin 106A over the p-well 102A and a fin 106B over the n-well 102B. Fins 106A and 106B are also referred to as fin structures 106A and 106B, fin elements 106A and 106B, etc., respectively. Fins 106A, 106B each include a substrate portion (i.e., a portion of substrate 102) and a semiconductor layer stack portion (i.e., a remaining portion of semiconductor layer stack 104 including semiconductor layers 110 and semiconductor layers 112). Fins 106A, 106B extend substantially parallel to one another along a Y-direction, having a length defined in the Y-direction, a width defined in an X-direction, and a height defined in a Z-direction. In some implementations, a lithography and/or etching process is performed to pattern semiconductor layer stack 104 to form fins 106A and 106B. The lithography process can include forming a resist layer over a semiconductor layer stack (for example, by spin coating), performing a pre-exposure baking process, perform exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist, pattern that corresponds with the mask. The etching process removes portions of the semiconductor layer stack using the patterned resist layer as an etch mask. In some embodiments, the patterned resist layer is formed over a hard mask layer disposed over the semiconductor layer stack, a first etching process removes portions of the hard mask layer to form a patterned hard mask layer, and a second etching process removes portions of the semiconductor layer stack using the patterned hard mask layer as an etch mask. The etching process can include a dry etching process, a wet etching process, other suitable etching process, or combinations thereof. In some embodiments, the etching process is a reactive ion etching (RIE) process. After the etching process, the patterned resist layer (and, in some embodiments, a hard mask layer) is removed, for example, by a resist stripping process or other suitable process. Alternatively, fins 106A, 106B are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some embodiments, directed self-assembly (DSA) techniques are implemented while patterning the semiconductor layer stack. Further, in some embodiments, the exposure process can implement maskless lithography, electron-beam (e-beam) writing, and/or ion-beam writing for patterning the resist layer.

An isolation feature(s) is formed over and/or in substrate 102 to isolate various regions, such as various device regions, of device 100. For example, the isolation features surround a bottom portion of fins 106A, 1069 such that isolation features separate and isolate fin 106A from fin 1069. In some embodiments, the isolation features surround the substrate portion of fins 106A, 1069 (e.g., p-well 102A, n-well 1029 of substrate 102) and partially surround the semiconductor layer stack portion of fins 106A, 106B (e.g., a portion of bottommost semiconductor layer 110). However, the present disclosure contemplates different configurations of isolation features relative to fins 106A, 106B. Isolation features include silicon oxide, silicon nitride, silicon oxynitride, other suitable isolation material (for example, including silicon, oxygen, nitrogen, carbon, or other suitable isolation constituent), or combinations thereof. Isolation features can include different structures, such as shallow trench isolation (STI) structures, deep trench isolation (DTI) structures, and/or local oxidation of silicon (LOCOS) structures. For example, isolation features can include STI features that define and electrically isolate fins 106A, 106B from other active device regions (such as fins) and/or passive device regions. STI features can he formed by etching a trench in substrate 102 (for example, by using a dry etching process and/or a wet etching process) and filling the trench with insulator material (for example, by using a CND process or a spin-on glass process). A chemical mechanical polishing (CMP) process may be performed to remove excessive insulator material and/or planarize a top surface of isolation features. In another example, STI features can be formed by depositing an insulator material over substrate 102 after forming fins 106A, 106B (in some implementations, such that the insulator material layer fills gaps (trenches) between fins 106A, 106B) and etching back the insulator material layer to form isolation features. In some embodiments, STI features include a multi-layer structure that fills the trenches, such as a silicon nitride layer disposed over a thermal oxide liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements. The isolation features may be formed in areas not illustrated on the cross sections of FIG. 1 (such as on planes that are parallel to the cross sections of FIG. 1). Accordingly, FIG. 1 does not illustrate the isolation features.

The device 100 also includes a gate structure 140A over a portion of fin 106A, and a gate structure 140B over a portion of fin 106B. The gate structure 140A will be configured for an n-type transistor (and thus corresponds with a portion spanning an n-type transistor region); and the gate structure 140B will be configured for a p-type transistor (and thus corresponds with a portion spanning a p-type transistor region). The gate structures 140A, 140B are further formed over the isolation features between the fins 106A and 106B. Gate structures 140A, 140B extend lengthwise in a direction that is different than (e.g., orthogonal to) the lengthwise direction of fins 106A, 106B. For example, gate structures 140A, 140B extend substantially parallel to one another along the X-direction, having a length defined in the X-direction, a width defined in the Y-direction, and a height defined in the Z-direction. Accordingly, FIG. 1 illustrates only a cross section of the gate structures 140A, 140B perpendicular to their lengthwise axis. In some embodiments, gate structure 140A. and gate structure 1409 are each portions of a gate structure that is disposed over a portion of fin 106A, a portion of fin 106B, and a portion of the isolation feature disposed between fin 106A and fin 106B, such that the gate structure spans fins 106A, 106B.

Gate structures 140A, 140B define channel regions 114 of fins 106A, 106E underneath the gate structures 140A, 1409. Furthermore, gate structures 140 define source/drain regions 115 on two sides of the channel regions (e.g. between two adjacent channel regions). Accordingly, in the X-Z plane, gate structures 140A, 140B wrap top surfaces and sidewall surfaces of the respective fins 106A, 106B. On the Y-Z plane, gate structures 140A, 140B are disposed over top surfaces of respective channel regions 114 of fins 106A, 1069, such that gate structures 140A, 140B interpose respective source/drain regions 115. Gate structures 140A, 140B each include a dummy gate stack that includes a dummy gate electrode layer 160, optionally a gate dielectric layer between the dummy gate electrode layer 160 and the fins 106A, 106B, and one or more mask layers (such as a hard mask layer 162 and a hard mask layer 164) over the dummy gate electrode layer 160. In the depicted embodiment, a width of dummy gate stacks (i.e., the width of dummy gate electrode layer 160) defines a gate length ($L_g$) of gate structures 140A, 1409 (here, in the Y-direction), where the gate length defines a distance (or length) that current (e.g., carriers, such as electrons or holes) travels between source/drain regions 115 when the n-type transistor and/or the p-type transistor are switched (turned) on.

The dummy gate electrode layer 160 includes a suitable dummy gate material, such as a polysilicon layer. In some embodiments, the gate dielectric includes a dielectric material, such as silicon oxide, a high-k dielectric material, other suitable dielectric material, or combinations thereof. Examples of high-k dielectric material include $HfO_2$, HfSiO, HfSiON, HfTaO, HiTiO, HfZrO, zirconium oxide, aluminum oxide, hafnium dioxide-alumina ($HfO_2$-$Al_2O_3$) alloy, other suitable high-k dielectric materials, or combinations thereof. In some embodiments, the gate dielectric includes an interfacial layer (including, for example, silicon oxide) disposed over fins 106A, 106B and a high-k dielectric layer disposed over the interfacial layer. Dummy gate stacks can include numerous other layers, for example, capping layers, interface layers, diffusion layers, barrier layers, other hard mask layers, or combinations thereof.

Dummy gate stacks are formed by deposition processes, lithography processes, etching processes, other suitable processes, or combinations thereof. For example, a deposition process is performed to form the dummy gate electrode layer 160 over fins 106A, 106B and the isolation features. In some embodiments, a deposition process is performed to form a gate dielectric layer over fins 106A, 106B and the isolation features before forming the dummy gate electrode layer 160. In such embodiments, the dummy gate electrode layer 160 is deposited over the gate dielectric layer. In some embodiment, a hard mask layer is deposited over the dummy gate electrode layer 160. The deposition process includes CVD, physical vapor deposition (PVD), atomic layer deposition (AM), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. A lithography patterning and etching process is then performed to pattern the dummy gate electrode layer 160 (and, in some embodiments, the gate dielectric layer and the hard mask layer) to form dummy gate stacks, such that dummy gate stacks (including the dummy gate electrode layer 160, the gate dielectric layer, the hard mask layers 162 and 164, and/or other suitable layers) is configured as depicted in FIG. 1. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

A gate spacer material layer 145 is disposed over gate structures 140A, 1409, in particular, adjacent to (i.e., along sidewalls of and on top surfaces of) respective dummy gate stacks, and fins 106A, 1069. Gate spacer material layer 145 is formed by any suitable process and includes a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over the dummy gate stacks. In some embodiments, gate spacer material layer 145 includes a multi-layer structure, such as a first dielectric layer that includes silicon nitride and a second dielectric layer that includes silicon oxide. In some embodiments, gate spacer material layer 145 includes more than one gate spacer material layers, such as various gate spacer material layers configured for seal spacers, offset spacers, sacrificial spacers, dummy spacers, and/or main spacers, to be formed adjacent to the dummy gate stacks. In such implementations, the various gate spacer material layers can include materials having different etch rates. For example, a first dielectric layer including, silicon and oxygen (e.g., silicon oxide) can be deposited to form a first spacer material layer adjacent to dummy gate stacks, and a second dielectric layer including silicon and nitrogen (e.g., silicon nitride) can be deposited to form a second spacer material layer adjacent to the first spacer material layer.

Figure 2:
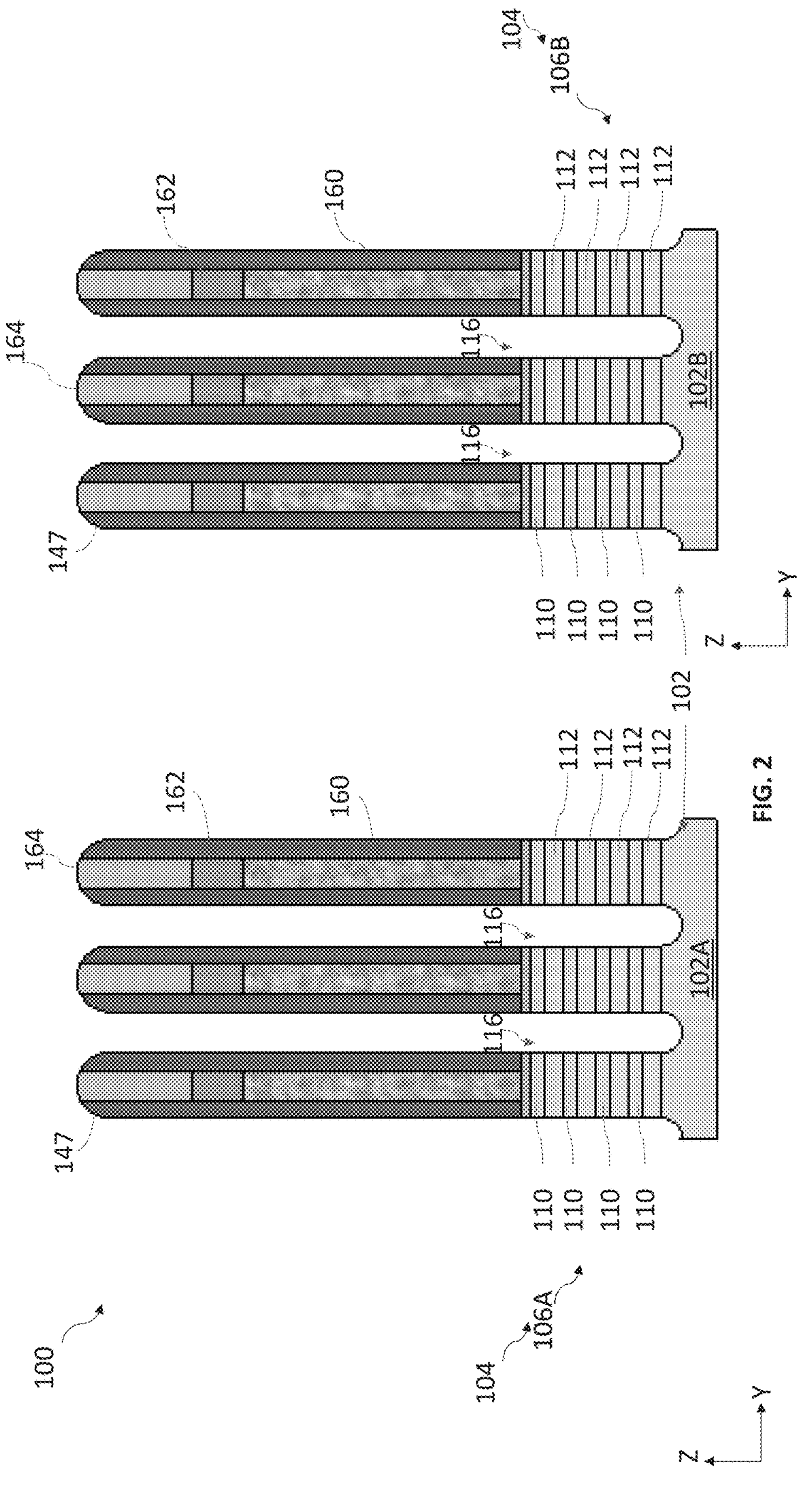

Turning to FIG. 2, the gate spacer material layer 145 is etched (e.g., anisotropically etched) to remove portions of the gate spacer material layer 145 over top surfaces of the dummy gate stacks and over surfaces of fins 106A, 1069. Accordingly, the gate spacer material layer 145 remains only on sidewalls of the dummy gate stacks, thereby forming gate spacers 147.

Furthermore, exposed portions of fins 106A, 106B (i.e., source/drain regions 115 of fins 106A, 106B that are not covered by gate structures 140A, 140B and gate spacers 147) are at least partially removed to form source/drain trenches (recesses) 116. In some embodiments, an etching process completely removes the portions of the semiconductor layer stacks 104 in source/drain regions 115 of fins 106A, 1069, thereby exposing the substrate portion of fins 106A, 106B (i.e., substrate 102) in source/drain regions 115. Source/drain trenches 116 thus have sidewalls defined by remaining portions of semiconductor layer stack 104, which are disposed in channel regions 114 under gate structures 140A, 140B, and bottoms defined by substrate 102, such as top surfaces of p-well 102A and n-well 102B in source/drain regions 115. In some embodiments, the etching process for forming source/drain recesses 116 is separate than the etching process for forming gate spacers 247. In some embodiments, the etching process for forming gate spacers 247 may begin formation of source/drain recesses 116, for example, by partially etching topmost semiconductor layers 110 of fins 106A, 1069. In some embodiments, the etching process removes some, but not all, of semiconductor layer stack 104, such that source/drain trenches 116 have bottoms defined by semiconductor layer 110 or semiconductor layer 112 in source/drain regions 115. In the depicted embodiment, the etching process further removes some, but not all, of the substrate portion of fins 106A, 106B, such that source/drain recesses 116 extend below a topmost surface of substrate 102. The etching process can include a dry etching process, a wet etching process, other suitable etching process or combinations thereof. In some embodiments, the etching process is a multi-step etch process. For example, the etching process may alternate etchants to separately and alternately remove semiconductor layers 110 and semiconductor layers 112. In some embodiments, parameters of the etching process are configured to selectively etch semiconductor layer stack with minimal (to no) etching of gate structures 140A, 140B (i.e., the dummy gate stacks and gate spacers 147) and/or isolation features. In some embodiments, a lithography process, such as those described herein, is performed to form a patterned mask layer that covers gate structures 140A, 140B and/or isolation features, and the etching process uses the patterned mask layer as an etch mask.

Figure 3:
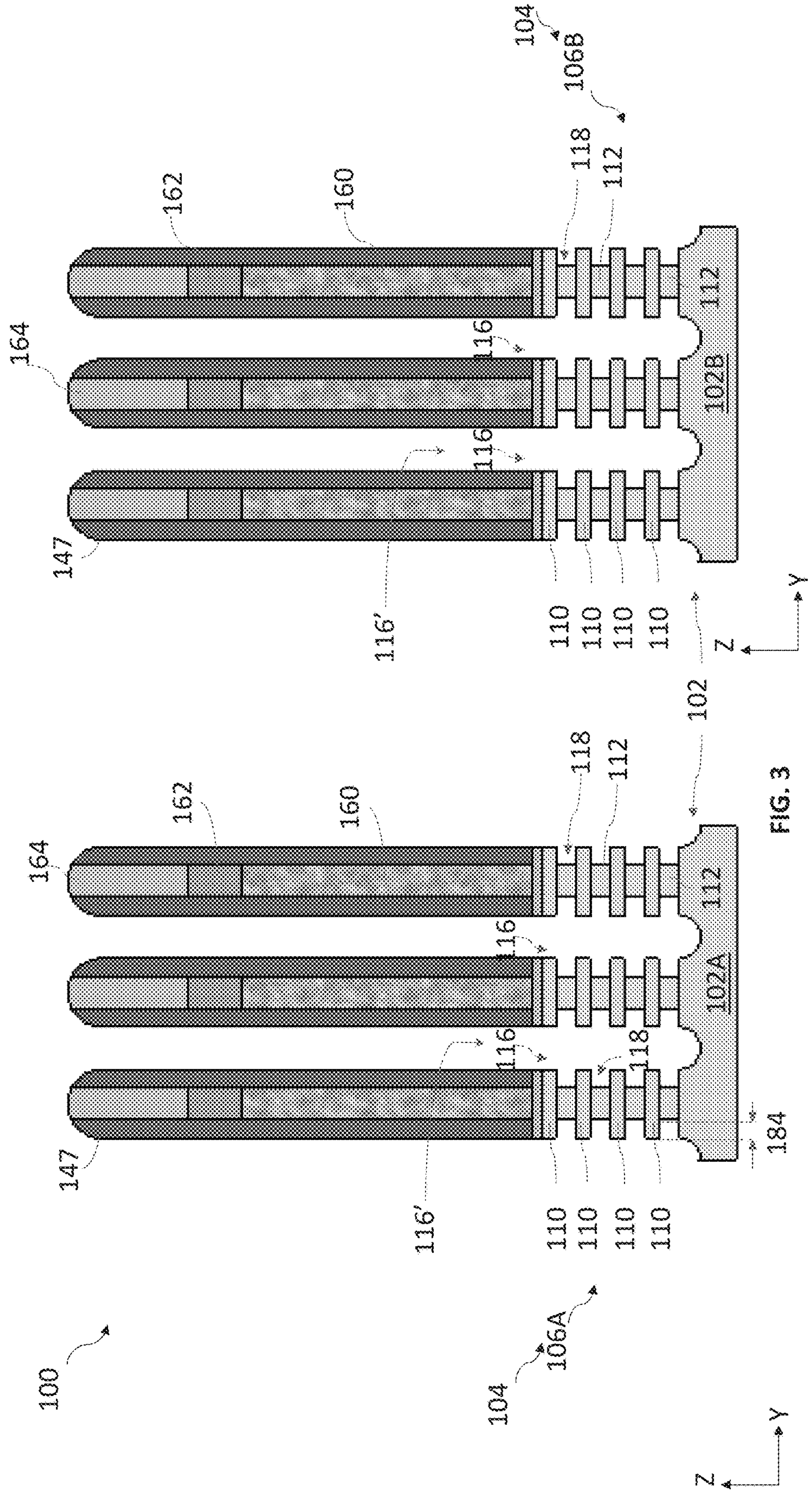

Turning to FIG. 3, gaps 118 are formed between semiconductor layers 110 for the subsequent formation of inner spacers therein. Any suitable method may be used to form the gaps 118. For example, an etching process is performed that selectively etches semiconductor layers 112 exposed by source/drain trenches 116 (for example, through sidewalls of the semiconductor layer stacks 104) with minimal (to no) etching of semiconductor layers 110. Additionally, gaps 118 are also formed between semiconductor layers 110 and substrate 102 under gate spacers 147. Portions (edges) of semiconductor layers 110 are thus suspended in the channel regions 114 under gate spacers 147. In some embodiments, the gaps 118 extend partially under the dummy gate stacks of gate structures 140A, 140B. The etching process is configured to laterally etch (e.g., along the Y-direction) semiconductor layers 112, thereby reducing a width of semiconductor layers 112 along the Y-direction. In some embodiments, the gap 118 has a length 184 along the Y-direction. In other words, the lateral width of the semiconductor layers 112 along the Y-direction is reduced by length 184. In some embodiments, the length 184 is about 6 nm to about 10 nm. If the length 184 is too short, such as less than 6 nm, there may be insufficient space for forming inner spacers that reliably separate subsequently formed epitaxial source/drain features from subsequently formed metal gates. If the length 184 is too large, such as greater than 10 nm, the subsequently formed metal gates may be of an inadequate length to achieve design goals. The etching process is a dry etching process, a wet etching process, other suitable etching process, or combinations thereof. As a result of the formation of the gaps 118, the source/drain trenches 116 are extended under and between adjacent semiconductor layers 110, to form extended source/drain trenches 116'.

Figure 4:
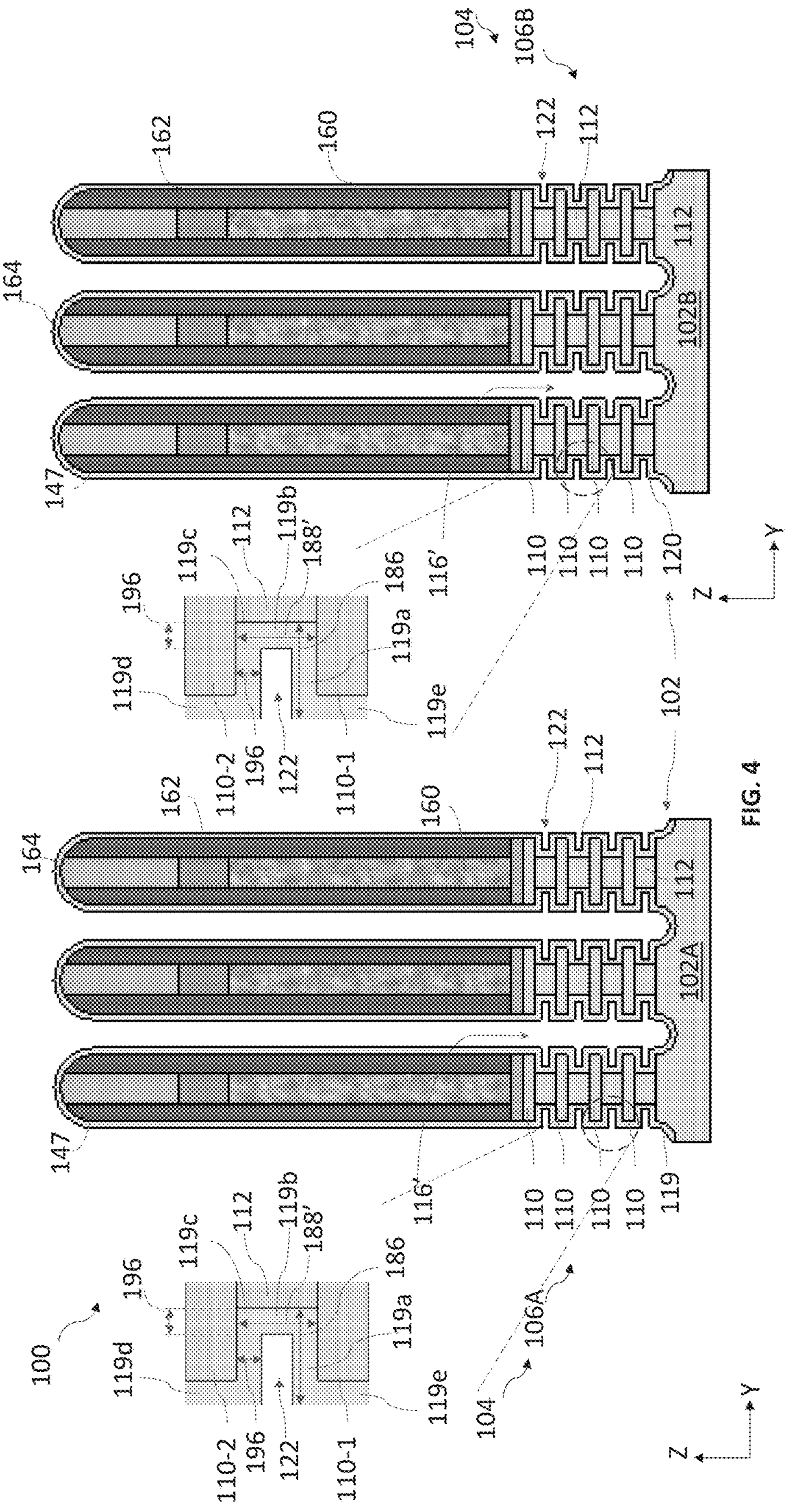

Turning to FIG. 4, a deposition process then forms a spacer layer 119 over the gate structures 140A, 140B and over features defining the extended source/drain trenches 116' (e.g., semiconductor layers 110, semiconductor layers 112, and substrate 102), by any suitable methods, such as CVD, PVD, ALD, HDPCVD, MOCVD, RPCVD, PECVD, LPCVD, ALCVD, APCVD, plating, other suitable methods, or combinations thereof. The spacer layer 119 partially fills the extended source/drain trenches 116'. The deposition process is configured to ensure that the spacer layer 119 partially fills the gaps 118 between semiconductor layers 110 and between semiconductor layers 110 and substrate 102 under gate spacers 147. The spacer layer 119 includes a material that is different than a material of semiconductor layers 110 and a material of gate spacers 147 to achieve desired etching selectivity during a subsequent etching process. In some embodiments, the spacer layer 119 includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the spacer layer 119 includes a low-k dielectric material, such as those described herein. In some embodiments, dopants (for example, p-type dopants, n-type dopants, or combinations thereof) are introduced into the dielectric material, such that spacer layer includes a doped dielectric material. In some embodiments, the spacer layer 119 is a conformal layer that includes various portions. For example, in an expanded view of a portion of the spacer layer 119 along various surfaces of device 100, the spacer layer 119 in the n-type transistor region includes a portion 119*a* formed on top surfaces of the semiconductor layers 110 (one of which is designated as semiconductor layer 110-1 in the expanded view), a portion 119*b* on sidewall surfaces of the semiconductor layers 112, a portion 119*c* on bottom surfaces of the semiconductor layers 110 (one of which is designated as semiconductor layer 110-2 in the expanded view), a portion 119*d* on sidewall surfaces of the semiconductor layers 110 (such as the semiconductor layer 110-2), and a portion 119*e* on sidewall surfaces of the semiconductor layers 110 (such as the semiconductor layer 110-1). The spacer layer 119 in the p-type transistor region also includes the portions 119*a*-119*e,* similar to those described herein, with respect to the semiconductor layers 110 (two of which are designated as semiconductor layer 110-1 and semiconductor layer 110-2 in the expanded view). The various portions of the spacer layer 119 all have a uniform thickness 196. In some embodiments, the thickness 196 is about 2 nm to about 4 nm. If the thickness 196 is too small, such as less than 2 nm, the inner spacer formed therefrom may not reliably separate subsequently formed epitaxial source/drain features from subsequently formed metal gates. If the thickness 196 is too large, such as greater than 4 nm, a U-shaped profile of the spacer layer 119 may not be achievable, such that benefits discussed below with respect to such a profile is lost. As described in more detail later, the thickness 196 may be selected and fine-tuned based on certain fabrication needs.

Each of the portions 119*a*-119*e* has the thickness 196 along the direction perpendicular to the surface along which they extend. As described above, the semiconductor layer 112 has a thickness 188. Accordingly, separation 188' between adjacent semiconductor layers 110 has a value that is the same as the thickness 188). In some embodiments, the separation 188' is greater than twice the thickness 196. Accordingly, a space exists between the portions 119*a* and portions 119*c*. In other words, the portions 119*a,* 119*b,* and 119*c* collectively define a gap 122 among them. In some embodiments, the gap 122 has a substantially rectangular profile. Moreover, each of the portions 119*a* and 119*c* has a length 186 along a lateral direction perpendicular to the sidewall surfaces of the semiconductor layers 110 and/or semiconductor layers 112. The length 186 is greater than the thickness 196. As described above, the portions 119*b* have the thickness 196 along the same lateral direction. Accordingly, the portions 119*a*, 119*b,* and 119*c* collectively have a profile that resembles the shape of the letter "U". In other words, the profile of the spacer layer 119 includes a plurality of segments that resembles the shape of the letter "U". In some embodiments, the U-shaped profile enables certain features to be achieved as described later, thereby improving the fabrication and/or performance characteristics of the device 100. Furthermore, the length 186 is greater than the length 184. Accordingly, the entirety of the semiconductor layers 110 on the illustrated Y-Z cross section is covered by the spacer layer 119.

Figure 5:
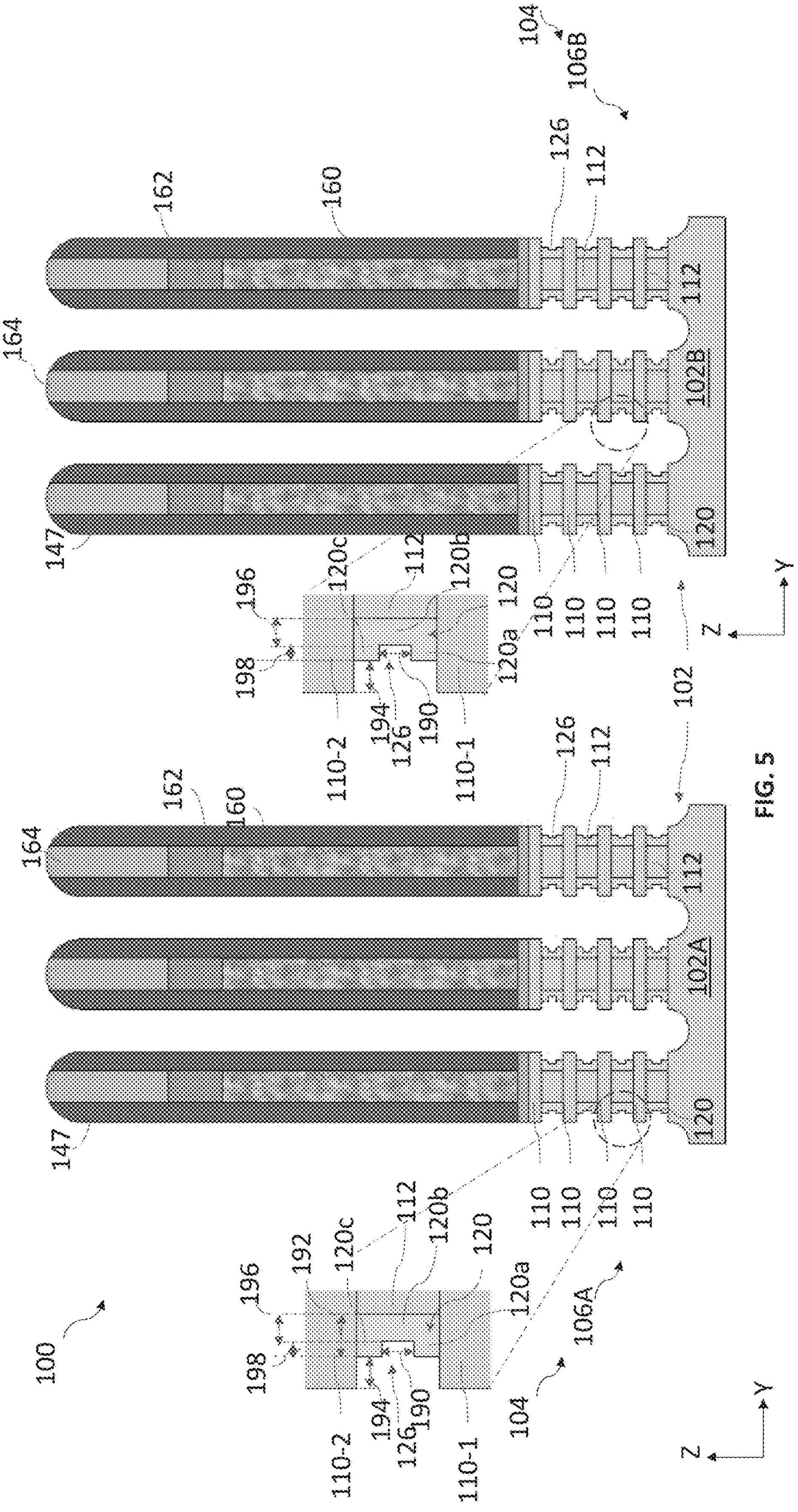

Turning to FIG. 5, an etching process is then performed that selectively etches the spacer layer 119 to form inner spacers 120 as depicted in FIG. 5. Meanwhile, minimal (to no) etching occurs to the semiconductor layers 110, dummy gate stacks of gate structure 140A, 140B, and gate spacers 147. In sonic embodiments, the spacer' layer 119 is removed from sidewalk of gate spacers 147, sidewalls of semiconductor layers 110, dummy gate stacks, and the substrate 102. Accordingly, portions 119*d* and 119*e* are removed during the etching process. In some embodiments, the portions 119*a* and 119*c* are also recessed during the etching process to form portions 120*a* and 120*c* of the inner spacers 120, respectively. For example, the portions 120*a* and 120*c* each have a length 192 that, is less than the length 186 of the portions 119*a* and 119*c*. Moreover, the length 192 is less than the length 184 (see FIG. 3). In some embodiments, the length 192 is about 4 nm to about 10 nm. If the length 192 is too small, such as less than 4 nm, totaling the desired U-shaped inner spacer may be difficult. If the length 192 is too large, such as greater than 10 nm, it may protrude out of the gaps 118 and unnecessarily occupy valuable chip space. Accordingly, a portion of top/bottom surfaces of semiconductor layers 110 is exposed in the gaps 118 after the etching process. For example, a portion of the semiconductor layers 110 having a length 194 is exposed in the gaps 118. The length 194 is about the same as the difference between length 184 and the length 192. In some embodiments, the portions 119*b* are not affected by the etching process. For consistency, the unmodified portions 119*b* are interchangeably referred to as portions 120*b* of the inner spacers 120. Accordingly, the thickness of the portion 120*b* remains unchanged and equal to thickness 196. some embodiments, the length 192 is greater than the thickness 196. Accordingly, the U-shape profile of the spacer layer 119 is preserved when it was etched, although the two prongs of the "U" are trimmed as compared to before the etching process. Additionally, the gaps 122 become gaps 126 and have a reduced depth 198. In some embodiments, the gaps 126 maintain a substantially rectangular profile. The depth 198 equals a difference between the length 192 and the thickness 196. In some embodiments, the depth 198 is about 2 nm to about 6 nm. If the depth 198 is too small, such as less than 2 nm, some of the benefits described herein with respect to the U-shaped profile may be lost. If the depth 198 is too large, such as greater than 6 nm, the exposed portions of the semiconductor layers 10 (haying a length 194) necessarily becomes too small, such that epitaxial growth from those surfaces may become less controlled. Because depth 198 may determine thickness of subsequently formed inner spacers (such as inner spacers 127A and 127B), it may be interchangeably referred to as thickness 198.

Figure 6A:
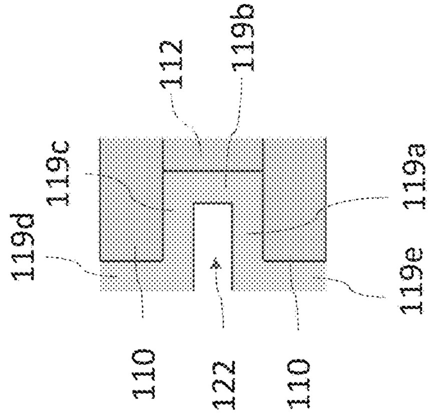
FIGS. 6A-6D are expanded fragmentary diagrammatic views of a portion of a nano-sheet-based device at various fabrication stages of an example processing method associated with FIG. 5 according to one embodiment of the present disclosure.
Figure 6B:
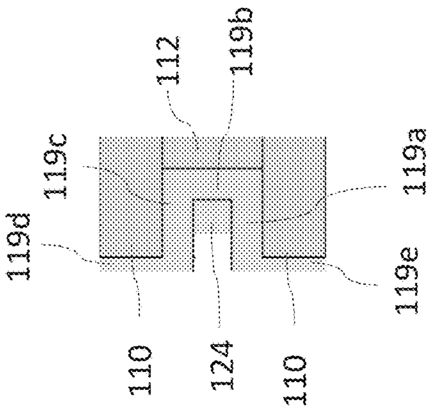
Figure 6C:
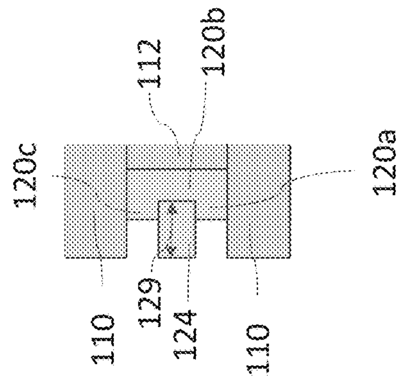
Figure 6D:
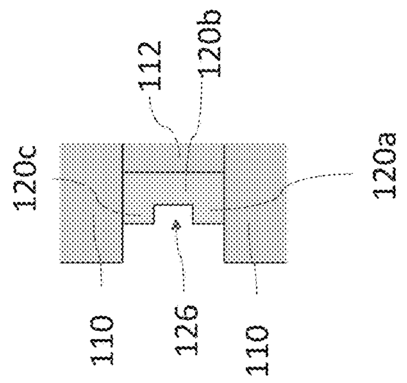

As described above, the portion 119*b* may not be affected during the etching of the portions 119*a,* 119*c,* 119*d,* and 119*e* regardless whether they include substantially the same materials or not, This process is referred to as controlled etching of the spacer layer 119. In some embodiments, referring to FIGS. 6A-61D, this is achieved by configuring the etching process to produce a byproduct capable of forming polymeric features in the gaps 122 (or the gaps 126). The polymeric features 124 block the etching chemical from diffusing through the gaps 122 (or the gaps 126), thereby protecting the portion 119*b* (or the portion 120*b*). The etching method may implement a wet etching method, a dry etching method, other suitable etching process, or combinations thereof. In some embodiments, the etching chemical may include a component having a fluorine element, such as trifluronitrogen ($NF_3$). The fluorine-containing component interacts with the dielectric material of the spacer layer 119, and/or interact with each other, such that portions of the dielectric material is removed from the surfaces of the inner spacer layer 119. Accordingly, the portions 119*d* and 119*e* are removed, and the portions 119*a* and 119*c* are etched.

Furthermore, as the etching of the spacer layer 119 progresses, byproducts form from the interactions among the etching chemical and the dielectric materials of the spacer layer 119. In some embodiments, at least a portion of the byproducts are trapped within the gaps 122 (or the gaps 126) to form the polymeric feature 124. In some embodiments, parameters of the etching processes are adjusted to control the materials, compositions, and the size of the polymeric features 124. For example, in some embodiments, the flow rate of the fluorine-containing component and the composition and flow rate of additional components of the etching gas are adjusted such that the polymeric features 124 include ammonia silicon fluoride ($(NH_4)_2SiF_6$). In some embodiments, the flow rate of the fluorine-containing component and the composition and flow rate of additional components of the etching gas are adjusted such that the polymeric features 124 include silicon fluoride ($SiF_4$). In still other embodiments, the parameters are adjusted such that the polymeric features 124 include other suitable materials, or combinations of the materials described herein.

Additionally, the parameters are adjusted such that the size of the polymeric features 124 are tuned to sufficiently block off the etching chemical from reaching the portion 119*b*. For example, the polymeric features 124 grow in size as the etching process progresses. Meanwhile, the size of the gaps 122 shrink and becomes that of the gaps 126. In some embodiments, the parameters are adjusted such that the polymeric features 124 cover the entirety of the sidewall surfaces of the portion 119*b* of the spacer layer 119. The polymeric features 124 are not prone to etching by the used etching chemical. Accordingly, the etching chemical is physically blocked off from the portions 119*b* by the polymeric features 124. In some embodiments, the polymeric features 124 do not cover the entirety of the sidewall surfaces of the portion 119*b*, yet the opening left between the semiconductor layers 110 and the polymeric features 124 may be too narrow for the etching chemical to pass through. Accordingly, the etching chemicals remain incapable of reaching the portions 119*b*. This scenario shares similarities with the alternative method of achieving the controlled etching of the spacer layer 119 described below with respect to FIGS. 7A-7C.

In some embodiments, at one stage, the polymeric features 124 completely fill the shrunk gaps 122 (or the gaps 126). As the etching process further proceeds, the polymeric feature 124 protrudes out from the gaps 126. In some embodiments, at the completion of the etching process, the polymeric features 124 have a length 129 along the Y-direction. Accordingly, the length 129 is greater than the depth of the gaps 126. In some embodiments, the etching reaction is terminated before the it reaches the plane along which the outmost sidewall surface of the portion 119*b* (which is also the interface between the polymeric feature 124 and the portion 119*b*) extends. Accordingly, the "U"-shape profile of the spacer layer is maintained. In some embodiments, this is achieved by controlling an etching time duration of the etching process. Subsequently, the polymeric feature 124 may be removed by any suitable methods to expose the outmost sidewall surface of the portion 119*b*. At this stage, the inner spacer 120 is formed.

Figure 7A:
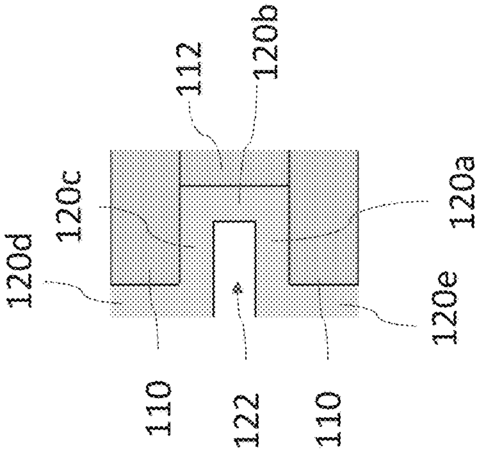
FIGS. 7A-7C are expanded fragmentary diagrammatic views of a portion of a nano-sheet-based device at various fabrication stages of another example processing method associated with FIG. 5 according to one embodiment of the present disclosure.
Figure 7B:
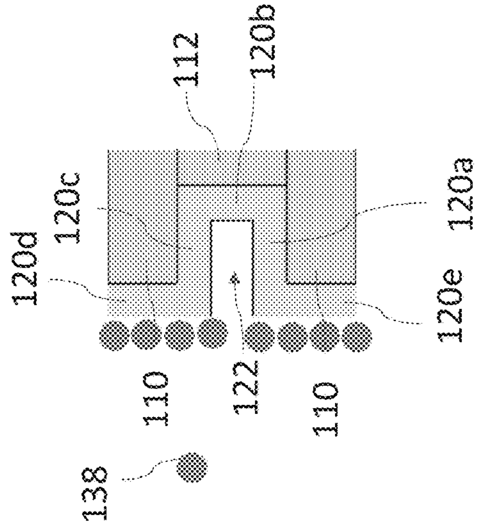
Figure 7C:
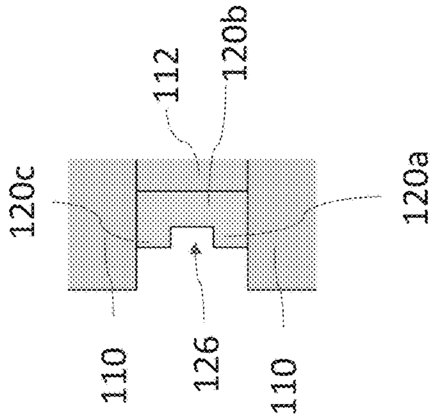

Alternatively or additionally, the controlled etching of the spacer layer 119 may be achieved by engineering the dimensions of the spacer layer 119. Referring to FIGS. 7A-7C, as described above, the spacing between the semiconductor layers 110-1 and 110-2 are the separation 188', and the spacer layer 119 has the thickness 196. The difference between the separation 188' and twice the thickness 196 defines the height 190 of the gaps 122 (and gaps 126). In some embodiments, the thickness 196 is configured such that the height 190 is less than a molecular radius (for example, a Van der Waals radius) of the selected etching chemical (such as etching chemical 138). Accordingly, the etching chemical cannot reach and thereby does not affect the portions 190*b*. In some embodiments, thickness 196 is configured such that the height 190 is less than about 3 nm. As a result, any etching chemical having a molecular radius greater than about 3 nm does not affect the portions 190*b* during the etching process. In some embodiments, the time duration of the etching process is controlled such that the length 192 of the portions 120*a* and 120*c* (at the end of the etching process) are greater than the width 196. The U-shape profile of the spacer layer 119 is thus preserved in the inner spacer 120.

As described above, the height 190 of spacer layer 119 and the identity of the etching chemical 138 (including its molecular radius) collectively dictates whether the etching chemical reaches the portion 119*b*. In some embodiments, the proper options of the etching chemical 138 may be limited by various other considerations, such as the materials of the semiconductor layers 110, the materials of the spacer layer 119, and/or the materials of the gate spacers 147. In such embodiments, it may be necessary to select the height 190 based on pre-selected etching chemicals 138. On the other hand, the height 190 is determined from the thickness 196 of the spacer layer 119 in conjunction with the separation 188' between the semiconductor layers 110. Accordingly, the thickness 196 may be engineered to achieve the controlled. etching. In some embodiments, the thickness 196 is accurately controlled using a fine-tuning process. For example, the device 100 of FIG. 4 (wrapped by the spacer layer 119 at this stage) may be subject to an oxidization treatment. The oxidization treatment converts a thin layer of the dielectric material of the spacer layer 119 into its corresponding oxidized product. This oxidized thin layer may have a different etching property as compared to the unoxidized dielectric material of the spacer layer 119. Accordingly, a selective etching process may be implemented to remove the oxidized thin layer without etching the unoxidized portion of the spacer layer 119. In some embodiments, the thin layer of the dielectric material oxidized has a thickness of less than about 1 nm. Such oxidization-etch processes (referred to as digital inner spacer etching processes) may be repeated as many times as needed in order to achieve the desired thickness (e.g. the thickness 196) of the spacer layer 119.

Figure 8:
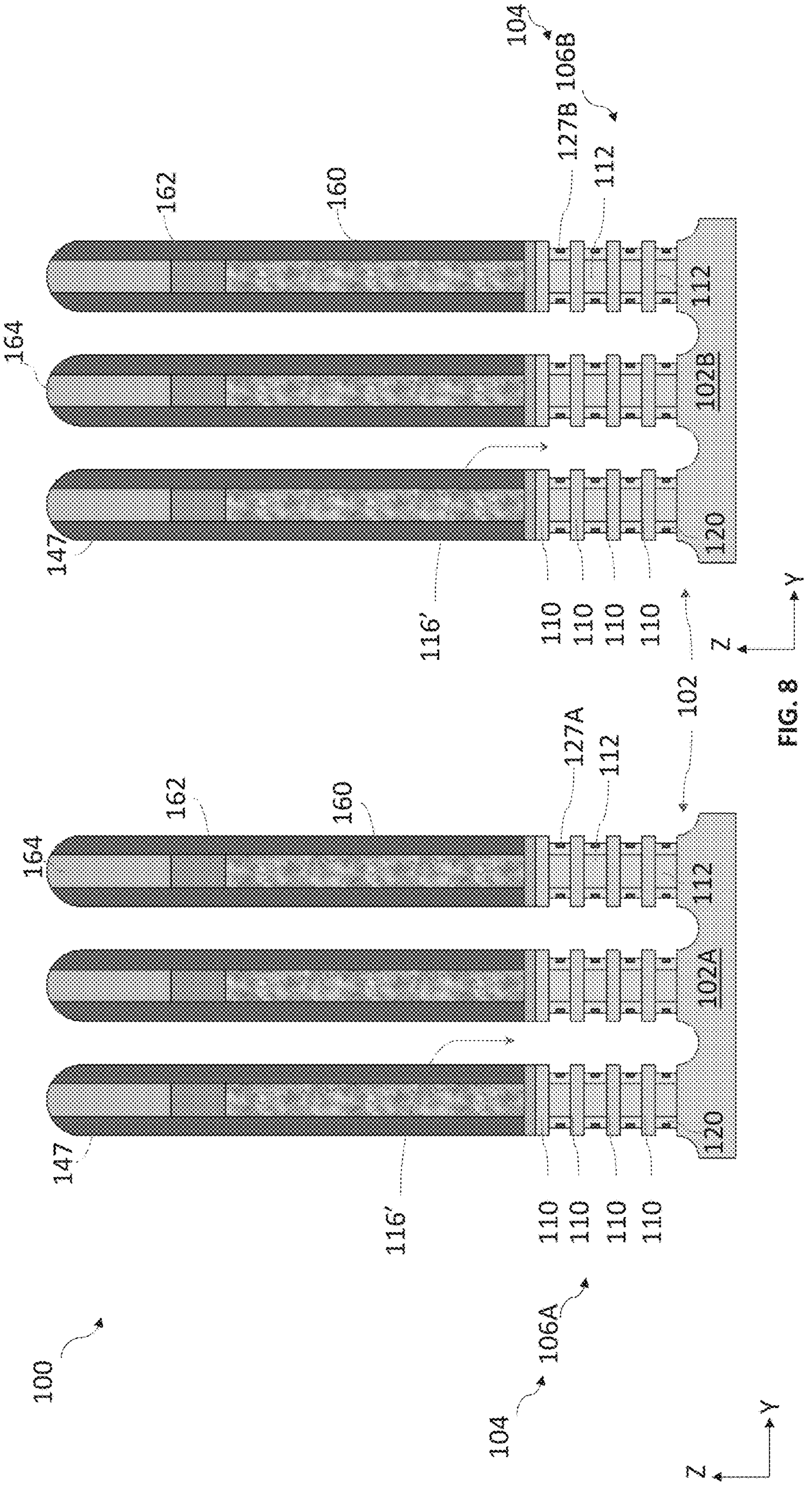

Turning to FIG. 8, optionally, a deposition process is performed to form inner spacers 127A and 127B. In some embodiments, a spacer material is deposited over the gate structures 140A, 140B and over features defining the remaining portions of the extended source/drain trenches 116' (e.g., semiconductor layers 110, inner spacers 120, and substrate 102), such as CVD, PVD, ALD, HDPCVD, MOCVD, RPCVD, PECVD, LPCVD, ALCVD, APCVD, plating, other suitable methods, or combinations thereof. The spacer material partially (and, in some embodiments, completely) fills the remaining portions of the extended source/drain trenches 116'. In some embodiments, the spacer materials fill the gaps 126. The spacer material of inner spacers 127A and 1279 may be different than a material of semiconductor layers 110, a material of the inner spacers 120, and a material of gate spacers 147 to achieve desired etching selectivity during a subsequent etching process. In some embodiments, the spacer material is a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the spacer material is a low-k dielectric material, such as those described herein. In some embodiments, dopants (for example, p-type dopants, n-type dopants, or combinations thereof) are introduced into the spacer material. In some embodiments, the spacer material includes an oxide, a nitride, or combinations thereof. As compared to air spacers (such as those described later), these spacer materials physically occupy the entirety of the gaps 126, such that subsequent epitaxial processes will not cause epitaxial materials to partially enter the gaps 126 thereby reducing the physical dimensions of the inner spacers 127A and 127B. In some embodiments, the inner spacers 127A and 127B has a substantially rectangular shape, consistent with the profile of the gaps 126.

In some embodiments, an etching process is conducted to remove the spacer materials on sidewalls of the gate spacers 147 and on the top, bottom, and sidewall surfaces of the semiconductor layers 110. Moreover, the etching process is configured to remove the spacer material from sidewall surfaces of the portions 120*a* and 120*c* of the inner spacers 120. In some embodiments, the parameters of the etching process are configured to maintain at least a portion of the spacer material within the gaps 126. The remaining portions of the spacer material become the inner spacers 127A and 127B. In some embodiments, the parameters adjusted include the time durations of the etching. In some embodiments, the etching process includes multiple steps, for example, configured to tune a size and/or profile of the inner spacer 127A and 127B. In some embodiments, the spacer material completely fills the gap 126. Accordingly, the inner spacers 127A and 1279 have a lateral width that equals the thickness 198 (see FIG. 5). In other embodiments, the etching process may leave the gap 126 only partially filled by the spacer material. Accordingly, the inner spacers 127A and 127B may have a lateral width that is less than the thickness 198. In some embodiments, the inner spacers 127A and 127B may have a height that is consistent with the height 190 of the gap 126 (see FIG. 5). Meanwhile, the inner spacers 120 may have a thickness consistent with the separation 188' between the semiconductor layers 110 (see FIG. 4). Accordingly, the inner spacers 127A and 127B have a dimension along the Z-direction that is less than the dimension of the inner spacers 120.

In some embodiments, the steps described above with respect to FIG. 8 are omitted. As described later, subsequent processing may result in voids (or air), rather than the dielectric material described above with respect to FIG. 8, to be formed the gaps 126. In other words, the inner spacers 127A and 127B are air spacers (also referred to as air gaps). The details and benefits for those embodiments are described in more detail later. In some embodiments, the parameters of the etching process are configured to leave the gap 126 partially filled. Accordingly, the inner spacers 127A and 127B may be considered to include a portion of the spacer material and a portion of air, such that it provides some of the benefits of both types of spacers. In other words, the composition of the inner spacers 127A and 127B may be tuned based on design needs.

Figure 9:
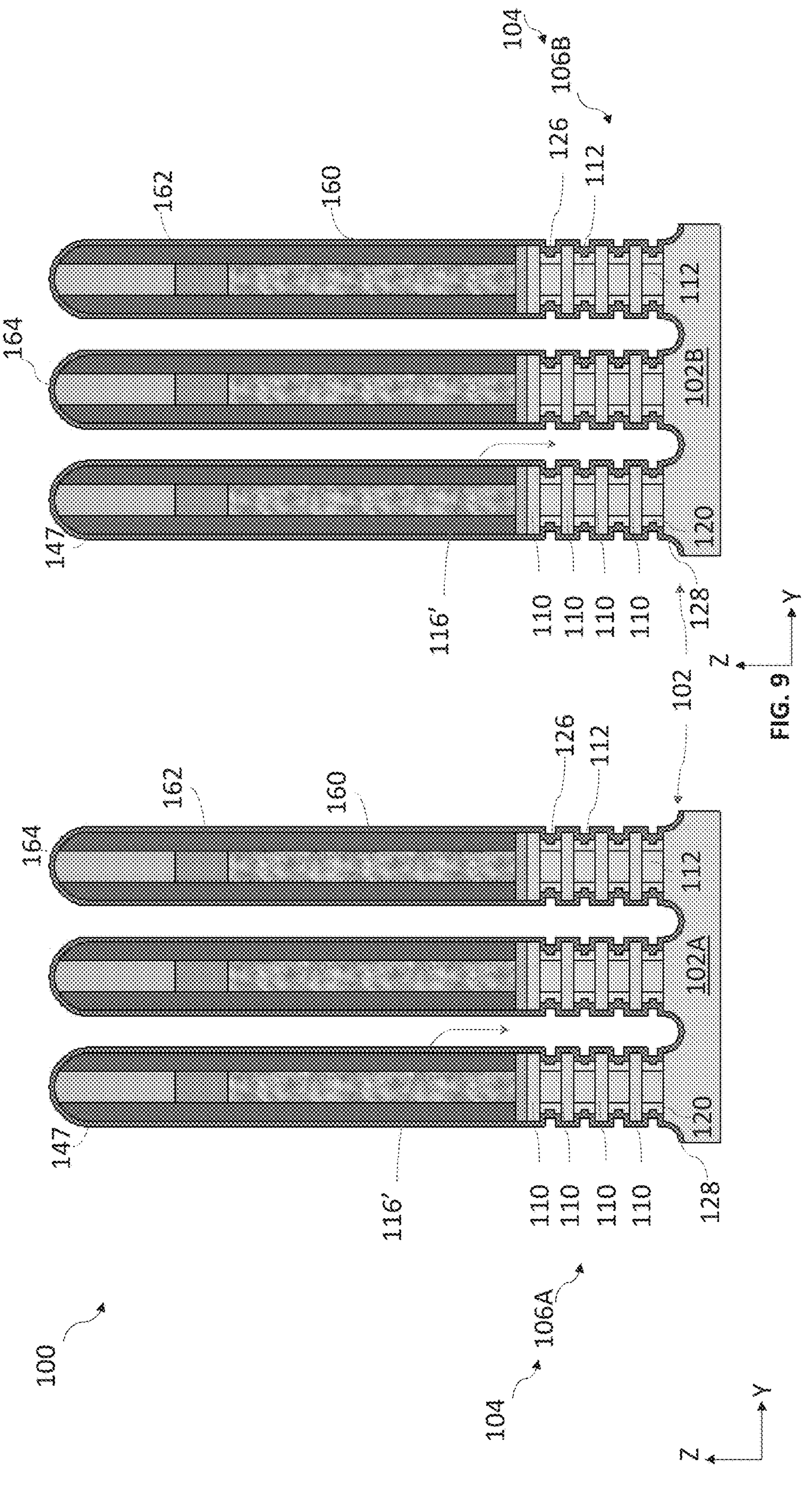

Turning to FIG. 9, processing associated with FIG. 5 continues by forming a hard mask layer 128 over the device 100, such that it covers the top surfaces of the dummy gate stacks, the gate spacers 147, the top, bottom, and sidewall surfaces of the semiconductor layers 110, the top, bottom, and sidewall surfaces of the inner spacers 120, and the top surface of the exposed substrate 102. In the case where the inner spacers 127A and 127B are formed from a dielectric material, such as depicted in FIG. 8, the hard mask layer 128 covers the top, bottom, and sidewall surfaces of the inner spacer 120. In some embodiments, the hard mask may protect device features during subsequent processing, such as during the epitaxial growth process described later.

Figure 10:
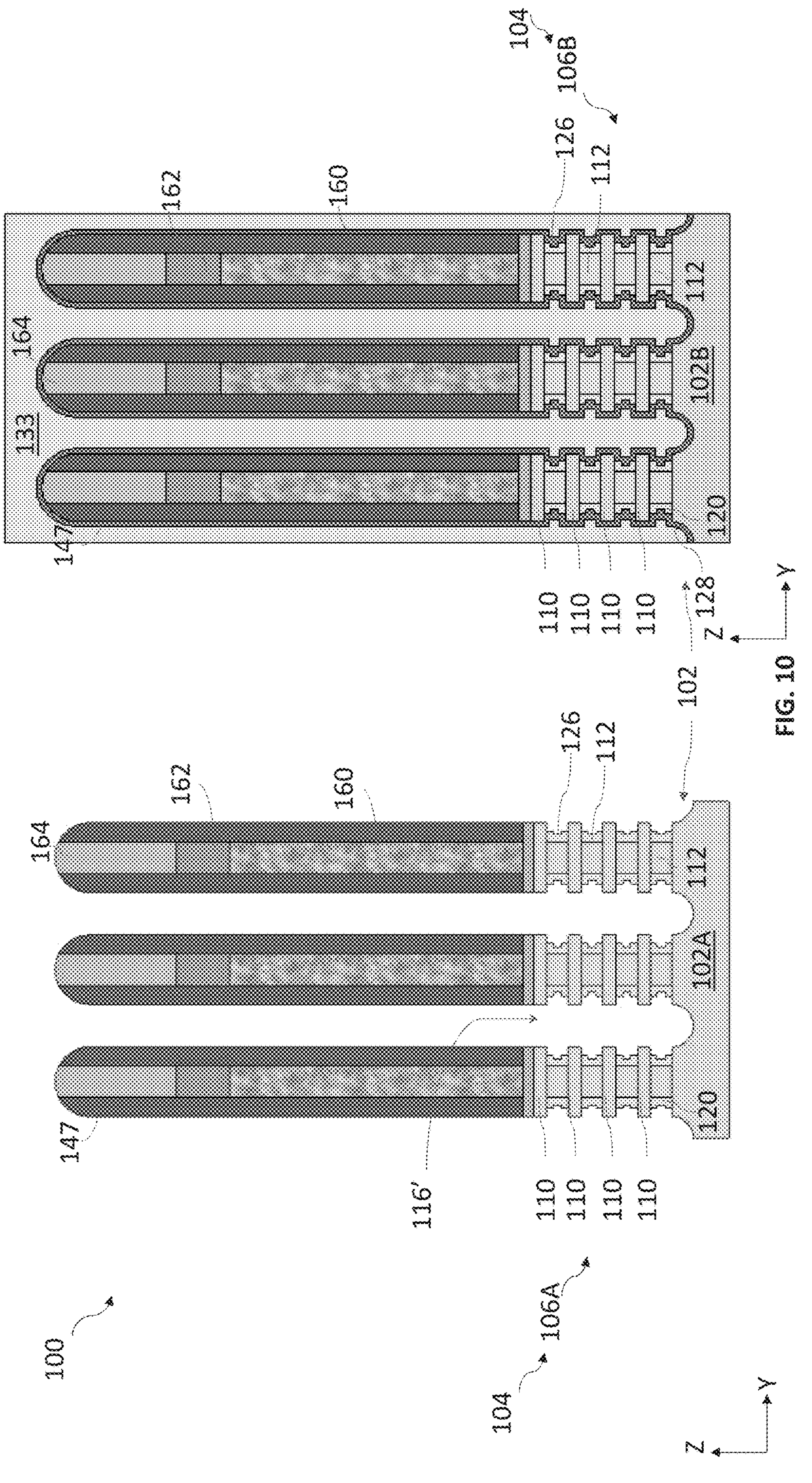

Turning to FIG. 10, a mask element 133 is formed over the p-type transistor region of the device 100, such as that corresponding with n-well 102B. The mask element 133 covers features in the p-type transistor region, such as the features of the device 100 over the n-well 102B and has an opening that exposes features in the n-type transistor region, such as the features of the device 100 over the p-well 102A. Accordingly, the features in the n-type transistor region are exposed by mask element 133. The mask element 133 may be any suitable material, such as a photoresist.

In some embodiments, the hard mask layer 128 is removed from the n-type transistor region. The hard mask layer 128 may be removed by any suitable methods, such as a dry etching method, a wet etching method, other suitable etching process, or combinations thereof. Accordingly, the sidewall surfaces of the top, bottom, and sidewall surfaces of the semiconductor layers 110 and the sidewall surfaces of the inner spacers 120 are exposed in the extended source/drain trenches 116'.

In some embodiments (not shown in FIG. 10), inner spacers 127A based on dielectric materials may be formed at this stage in the n-type transistor region, for example, according to the method described above with respect to FIG. 8. However, as the p-type transistor region is covered by the mask element 133, the inner spacers 127B is not formed in the p-type transistor region at the same time. Rather, inner spacers 127B may be formed at a later stage. This process allows the device 100 to have a different inner spacer structures in different regions, including, for example, inner spacers 120 and inner spacers 127A in the n-type transistor region and inner spacers 120 and inner spacers 127B in the p-type transistor region. In these embodiments, the materials for the inner spacers 127A and 127B may be the different. For example, the inner spacers 127A and 127B may include different dielectric materials. Alternatively, the inner spacers 127A may include a dielectric material, while the inner spacers 127B may be air (as described later).

Figure 11:
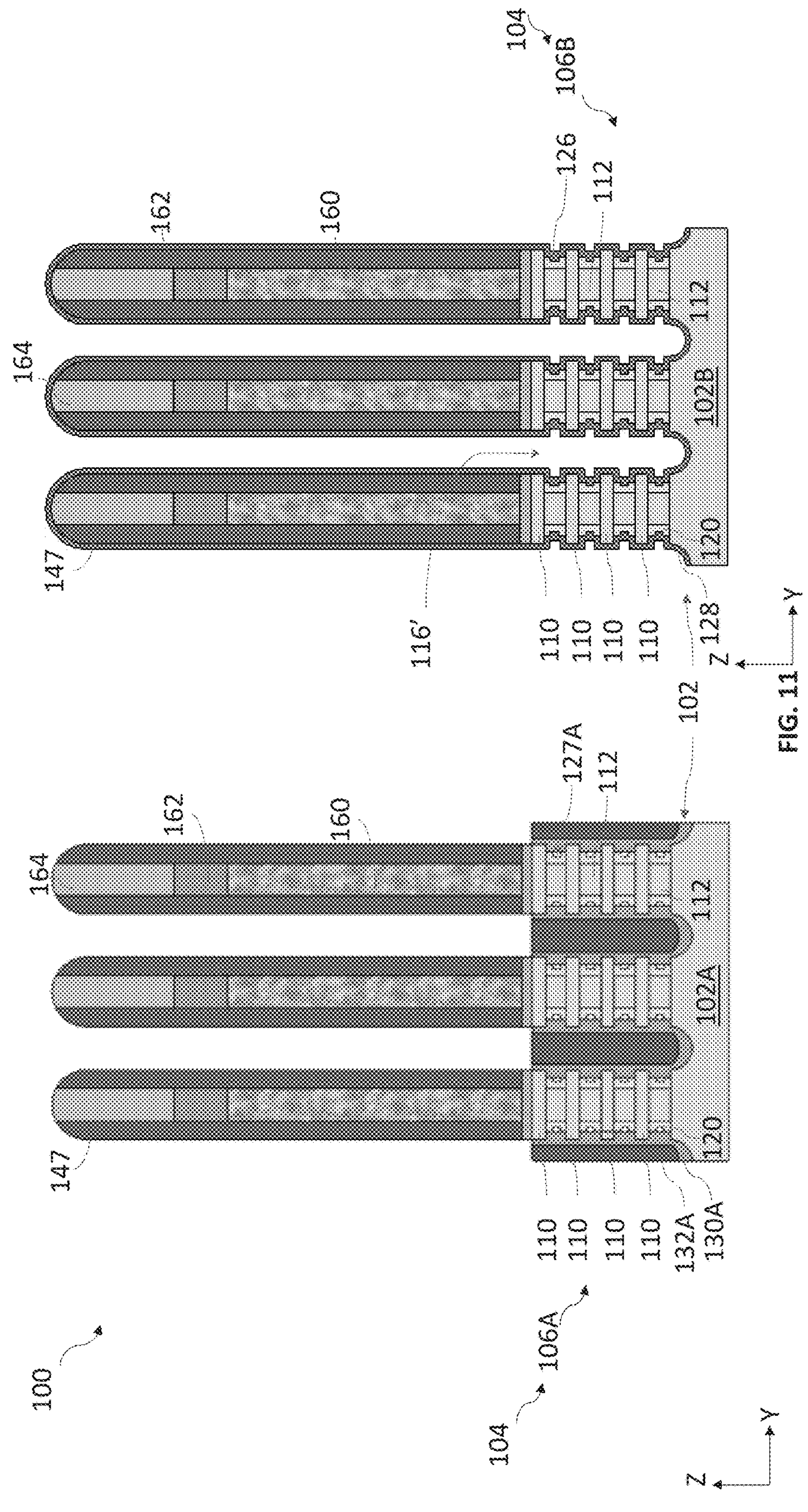

Turning to FIG. 11, epitaxial source/drain features are formed in the extended source/drain trenches 116' in the n-type transistor region. In some embodiments, the epitaxial source/drain features each include more than one epitaxial source/drain layers. For example, a first semiconductor material is epitaxially grown from portions of substrate 102 and from the portions of the semiconductor layers 110 exposed by the extended source/drain trenches 116'. Consequently, epitaxial source/drain layers 130A are formed in the source/drain regions 115 of the n-type transistor region. For example, the epitaxial source/drain layers 130A arc formed to interface with the exposed surfaces of the extended source/drain trenches 116'. Then, second epitaxial source/drain layers 132A are formed over and interfacing with the epitaxial source/drain layers 130A. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 102 and/or semiconductor layers 110. Epitaxial source/drain layers 130A and 132A are doped with n-type dopants. In some embodiments, epitaxial source/drain layers 130A and/or 132A include silicon. Epitaxial source/drain layers 130A and/or 132A can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, epitaxial source/drain lavers 130A and 132A include the same or different materials and/or the same or different dopant concentrations. In some embodiments, epitaxial source/drain layers 130A and/or 132A include materials and/or dopants that achieve desired tensile stress and/or compressive stress in respective channel regions 114. In some embodiments, epitaxial source/drain layer 130A and/or 132A are doped during deposition by adding impurities to a source material of the epitaxy process (i.e., in-situ). In some embodiments, epitaxial source/drain layers 130A and/or 132A are doped by an ion implantation process subsequent to a deposition process. In some embodiments, annealing processes (e.g., rapid thermal annealing (RTA) and/or laser annealing) are performed to activate dopants in epitaxial source/drain layers 130A and/or 132A and/or other source/drain regions (for example, heavily doped source/drain regions and/or lightly doped source/drain (LDD) regions). After the epitaxial source/drain layers 130A and/or 132A are formed, the mask element 133 over the p-type transistor region is removed.

In the depicted embodiment of FIG. 11 the deposition of the spacer material described above with respect to FIG. 8 has been omitted. In some embodiments, the deposition and removal of the hard mask layer 128 do not cause the gaps 126 to be filled. Accordingly, the gaps 126 remain empty (or void) at this processing stage. Because epitaxial growth of the epitaxy material on dielectric materials (and air) is minimal as compared to the epitaxial growth on semiconductor materials (such as on the exposed top surfaces and bottom surfaces of the semiconductor layers 110), the epitaxial material predominantly grows from the semiconductor layers 110 and merges without interfacing with the portion 120*b* of the inner spacers 120. In other words, the gap 126 remains (in some embodiments, at least partially unfilled) after forming the epitaxial source/drain features. As a result, air spacers are defined between the inner spacers 120 and the epitaxial source/drain features. In other words, the inner spacers 127A are air spacers((instead of spacers with other dielectric materials, such as depicted in FIG. 8). Air has reduced dielectric constant as compared to other dielectric spacer materials. Accordingly, the inner spacers 127A being an air spacer reduces the parasitic capacitance between the gate structure and the source and drain regions, thereby improving the overall device performances. In some embodiments, gaps 126 are left entirely unfilled. Meanwhile, the epitaxial source/drain layer 130A may interfaces directly with sidewalk of the portions 120*a* and 120*c* of the inner spacers 120. Accordingly, the inner spacer 127A. has the thickness 198 along the Y-direction, consistent with the length dimension of the portions 120*a* and 120*c* of the inner spacer 120. In some embodiments, the gaps 126 are left partially unfilled after forming the epitaxial source/drain features, for example, a portion of the epitaxial source/drain layer 130A protrudes into the gaps 126. Accordingly, the inner spacer 127A (or air spacer) may have a thickness along the Y-direction that is less than the thickness 198. In some embodiments, the inner spacer 127A may have a varying thickness along the Z-direction. In some embodiments, the inner spacers 127A (or air spacer) may have a height that is consistent with the height 190 of the gap 126 (see FIG. 5). Meanwhile, the inner spacers 120 may have a thickness consistent with the separation 188' between the semiconductor layers 110 (see FIG. 4). Accordingly, the inner spacers 127A have a dimension along the Z-direction that is less than the dimension of the inner spacers 120.

In the depicted embodiment of FIG. 11, the epitaxial source/drain layers 130A has a sidewall that is partially exposed to the air of the inner spacer 127A (or air spacer). Alternatively, in some embodiments where the inner spacer 127A has been formed from a dielectric material (as illustrated in FIG. 8 above), the epitaxial source/drain layers 130A are formed on (and shares an interface with) the dielectric material of the inner spacer 127.

Figure 12:
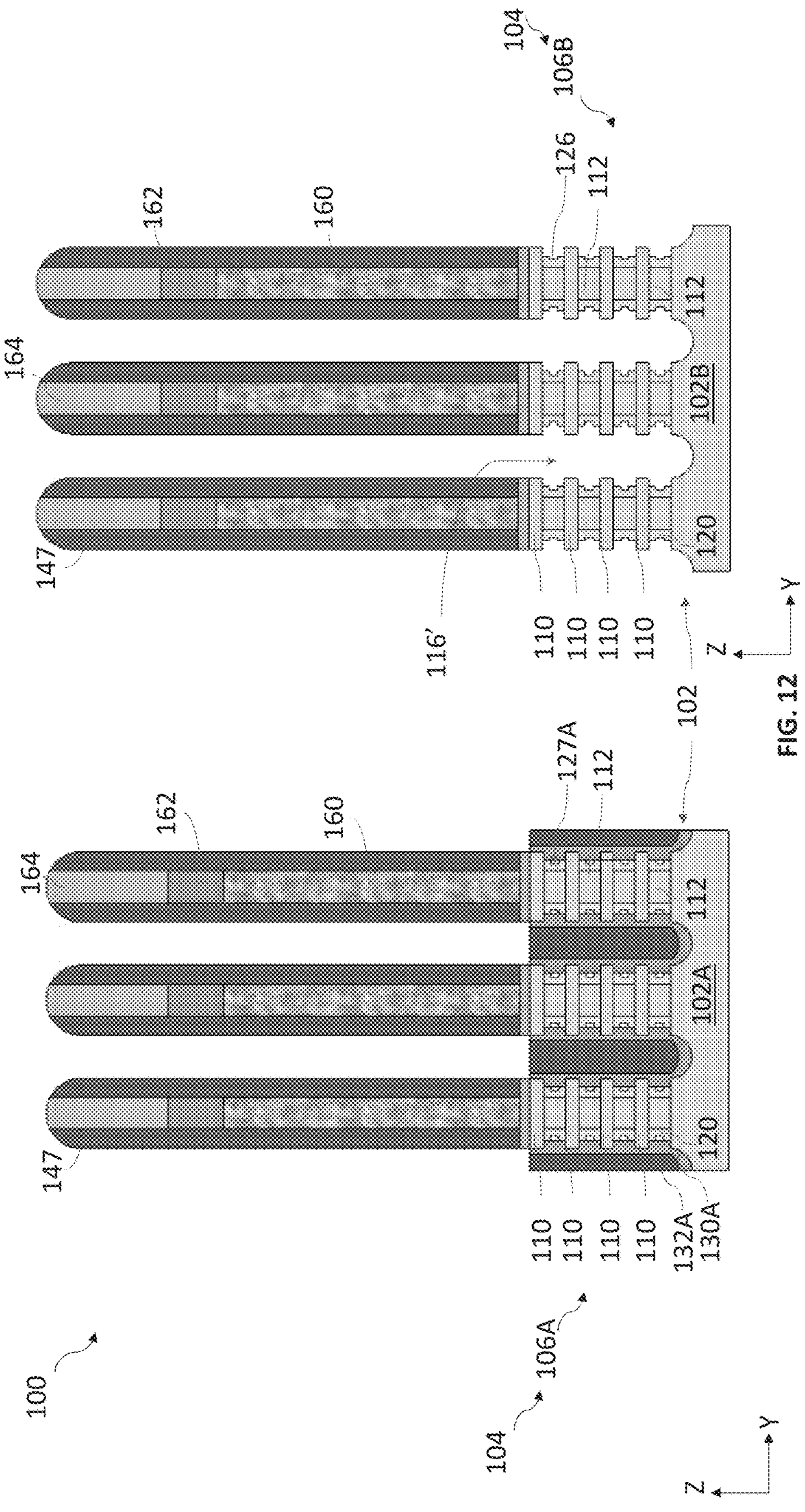

Turning to FIG. 12, the hard mask layer 128 may be removed by any suitable methods, such as a dry etching method, a wet etching method, other suitable etching process, or combinations thereof. Accordingly, the underlying surfaces below the hard mask layer 128 are exposed. In the depicted embodiment, the top, bottom, and sidewall surfaces of the semiconductor layers 110 and the top, bottom, and sidewall surfaces of the inner spacers 120 are exposed in the extended source/drain trenches 116'. Where the device 100 includes inner spacers 127A and 127B as depicted in FIG. 8, the sidewall surfaces of the top, bottom, and sidewall surfaces of the semiconductor layers 110, the sidewall surfaces of the inner spacers 120, and the sidewall surfaces of the inner spacers 127B are exposed in the extended source/drain trenches 116'. In some embodiments, the removal of the hard mask layer 128 make space for deposition of new hard mask layers (such as hard mask layer 134 below) without unduly occupying valuable device space.

Figure 13:
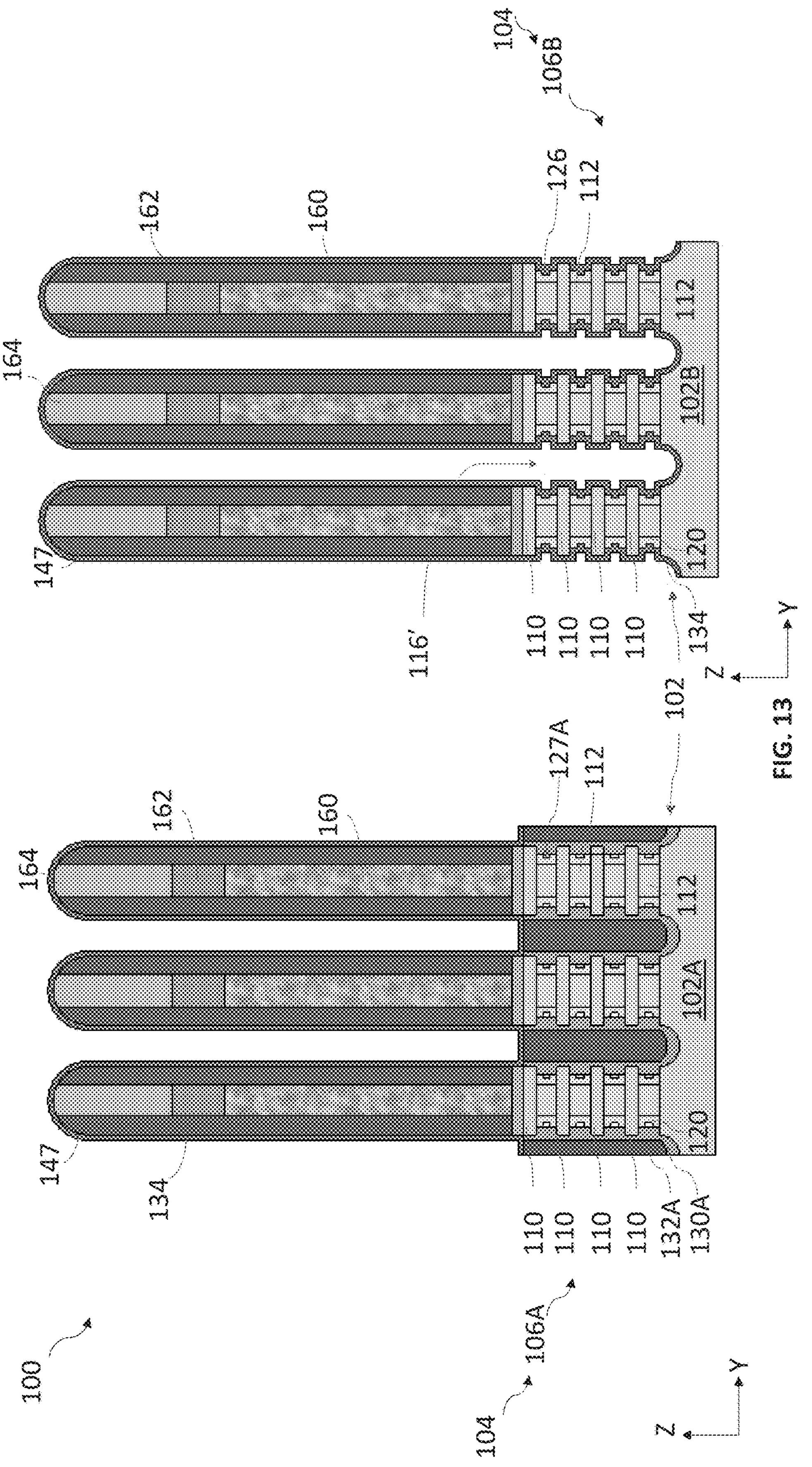

Turning to FIG. 13, a hard mask layer 134 is formed over the device 100, such that, it covers the top surfaces of the dummy gate stacks, the gate spacers 147, the top surfaces of the epitaxial source/drain features in the n-type transistor region. The hard mask layer 134 also covers the p-type transistor region, such as the top, bottom, and sidewall surfaces of the semiconductor layers 110, the top, bottom, and sidewall surfaces of the inner spacers 120, and the top surface of the exposed substrate 102 in the n-well 102B. In the depicted embodiment, the hard mask layer 134 further partially fills the gap 126. In embodiments where the p-type transistor region includes inner spacers 127, the hard mask layer 134 instead further covers the sidewall surfaces of the inner spacers 127. Hard mask layer 134 is similar to hard mask layer 132 described above.

Figure 14:
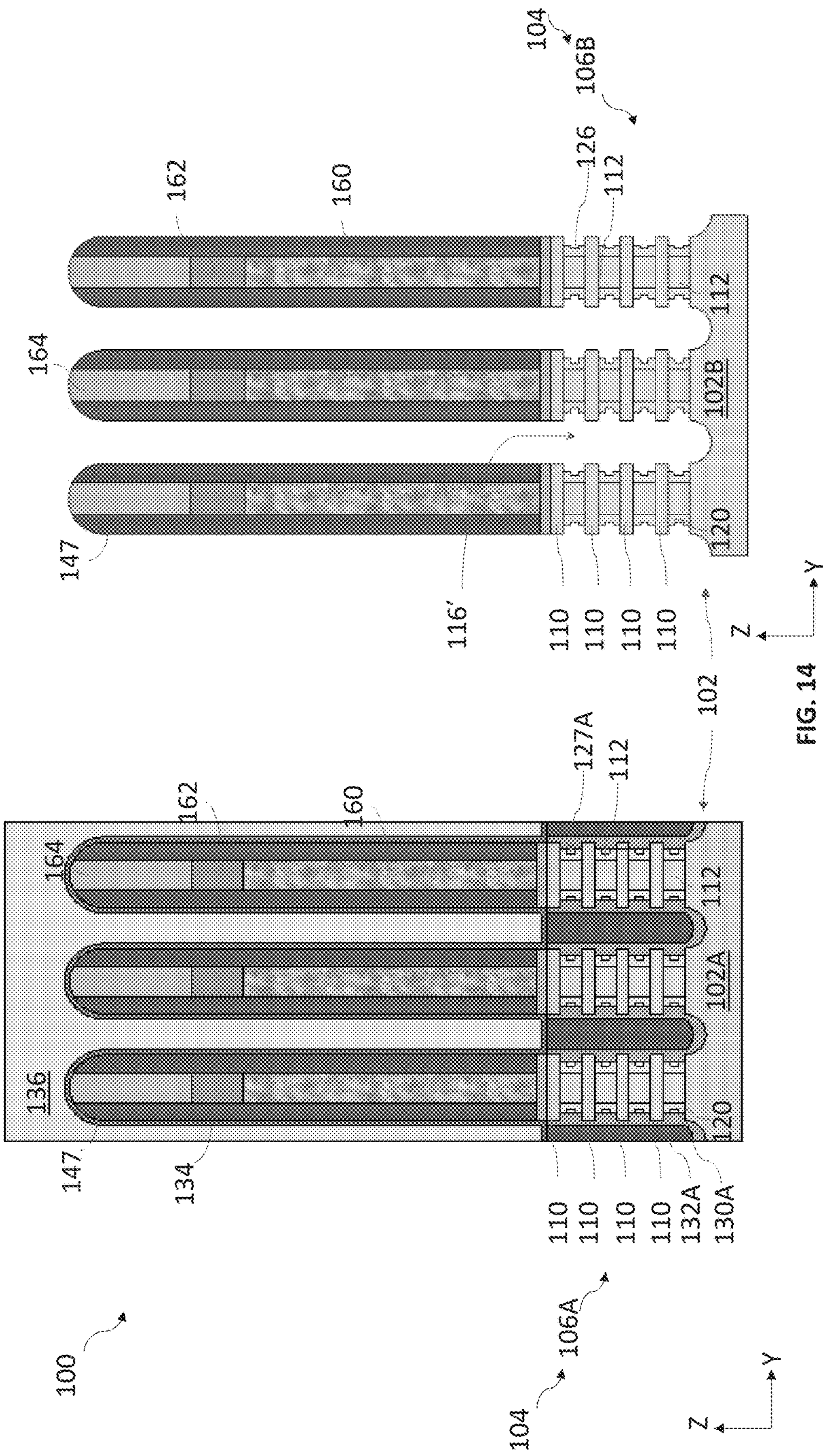

Turning to FIG. 14, a mask element 136 is formed over the n-type transistor region of the device 100, such that the mask element 136 covers the hard mask layer 134 in the n-type transistor region (corresponding with p-well 102A) while exposing features in the p-type transistor region (corresponding with the n-well 102B). The mask element 136 is similar to the mask element 133 described above with respect to FIG. 10. The mask element 136 allows selective processing in the p-type transistor region. In the depicted embodiment, the top, bottom, and sidewall surfaces of the semiconductor layers 110 and the top, bottom, and sidewall surfaces of the inner spacers 120 are exposed in the extended source/drain trenches 116'. In the depicted embodiment, the inner spacers 1278 has not been formed at this stage. Accordingly, the gap 126 remain unfilled. As described later, the subsequent epitaxy process encloses the gap 126 to form air spacers that serve as the inner spacers 127B. However, in embodiments where inner spacers 127B has already been formed (such as depicted in FIG. 8), subsequent epitaxial process forms on the sidewall surfaces of the dielectric material-based inner spacers 127B. In still other embodiments, dielectric material-based inner spacers 127E may he formed at this stage. Because the n-type transistor region is covered by the mask element 136, no inner spacers 127A will be formed in the n-type transistor region. Accordingly, the device 100 may have different spacer structures in the n-type transistor region (such as including inner spacers 120 and inner spacers 127A) and in the p-type transistor region (such as including inner spacers 120 and inner spacers 127B). In these embodiments, the materials for the inner spacers 127A and 127B may be the different. For example, the inner spacers 127A and 127B may include different dielectric materials. Alternatively, the inner spacers 127A may include a dielectric material, while the inner spacers 127B may be air, or vice versa.

Figure 15:
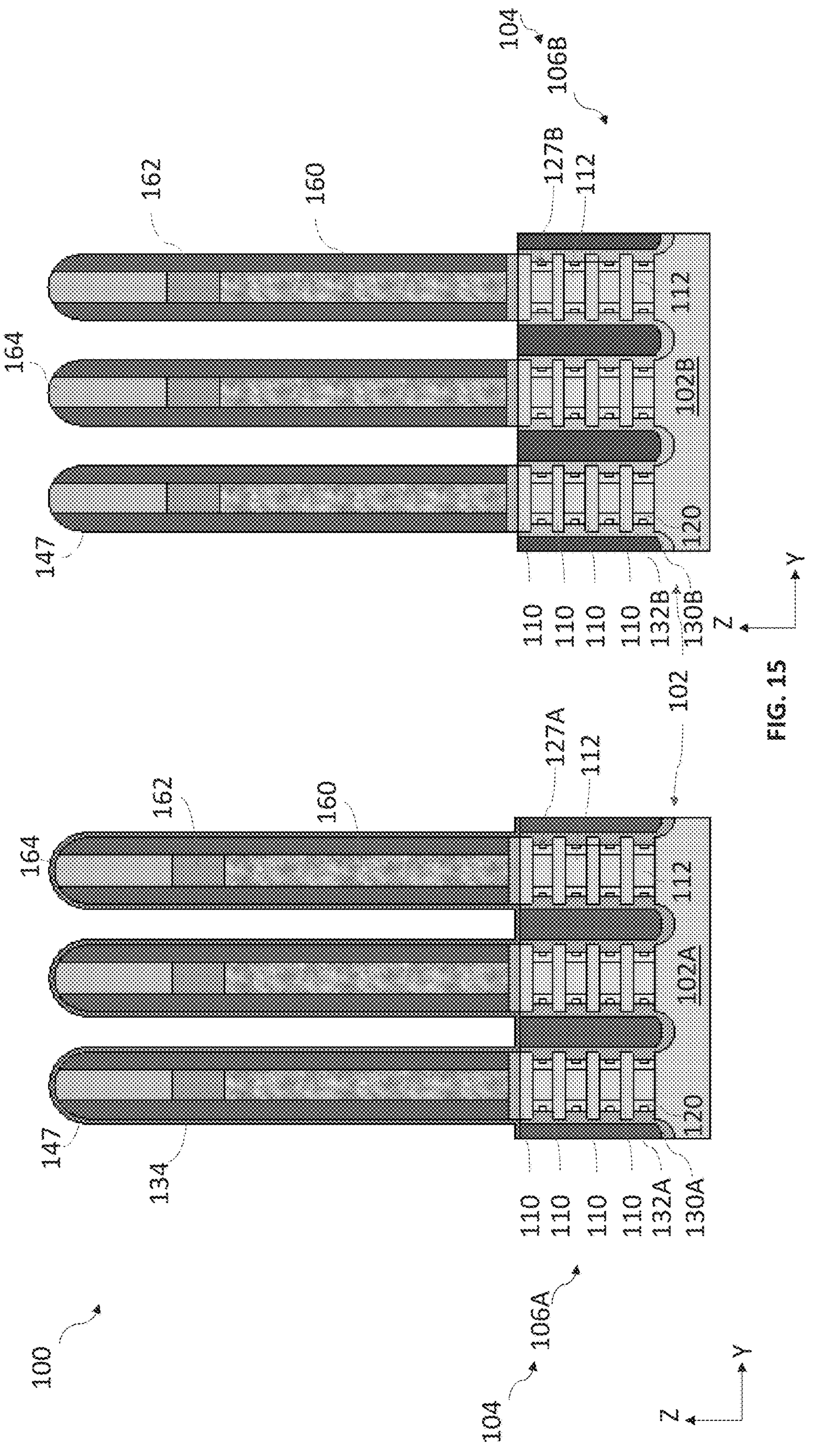

Turning to FIG. 15, epitaxial source/drain features are formed in the extended source/drain trenches 116' in the exposed p-type transistor region. In some embodiments, the epitaxial source/drain features may include multiple layers, such as epitaxial source/drain layers 130B and 132B. The epitaxial source/drain layers 130B and 132B may be formed by any suitable methods, such as an epitaxy process described above with respect to FIG. 11. The epitaxial source/drain layers 130B and 132B share certain similarities with the epitaxial source/drain layers 130A and 132A of the n-type transistor region, respectively. For example, the epitaxial source/drain layer 132B may be epitaxially grown from and interfacing with he epitaxial source drain layers 130B. Epitaxial source/drain layers 130B and 132B differ from the epitaxial source/drain layers 130A and 132A in that they may include different materials and may be doped with different types of dopants. In sonic embodiments, epitaxial source/drain layers 130B and/or 132B include silicon germanium or germanium. Epitaxial source/drain layers 130B and/or 132B can be doped with p-type dopants, such as boron, boron fluoride ($BF_2$), other p-type dopant, or combinations thereof (for example, forming Si:Ge:B epitaxial source/drain features). In some embodiments, epitaxial source/drain layers 130B and 132B include the same or different materials and/or the same or different dopant concentrations. In some embodiments, epitaxial source/drain layers 130B and/or 132B include different materials and/or different dopant concentrations in order to achieve an etching selectivity in subsequent etching processes. In some embodiments, epitaxial source/drain layers 130B and/or 132B include materials and/or dopants that achieve desired tensile stress and/or compressive stress in respective channel regions 114. After the epitaxial source/drain layers 130B and/or 132B are formed, the mask element 136 over the n-type transistor region is removed.

As described above, the epitaxial source/drain layers 130B are epitaxially grown from portions of substrate 102 and from semiconductor layers 110 exposed by the extended source/drain trenches 116' in the source/drain regions 115 of the p-type transistor regions. In some embodiments, the epitaxial source/drain layers 130B is formed on sidewall surfaces of the inner spacer 127B. The inner spacer 127B in the p-type transistor region generally resembles the inner spacer 127A in the n-type transistor region. In some embodiments, the inner spacer 127B may be an air spacer. For example, the epitaxial source/drain layers 130B grow from the exposed top and bottom surfaces of the semiconductor layers 110 and merge with each other without contacting the portions 120*b* of the inner spacer 120. Accordingly, the gaps 126 are at least partially unfilled, and air spacers are formed therein. In some embodiments, the inner spacers 127B may also be a dielectric material-based spacer. For example, the dielectric material may he deposited into the gap 126 at the processing stage associated with FIG. 8, or following the processing stage associated with FIG. 14.

Moreover, epitaxial source/drain layers 130B may have dimensions and/or profiles that resemble those of the epitaxial source/drain layers 130A. In the depicted embodiment, the entire gaps 126 are left empty. In other words, the inner spacer 127B is an air spacer that occupies the entirety of the gap 126. Accordingly, the inner spacer 127 has a thickness 198 along the Y-direction, consistent with the length dimension of the portions 120*a* and 120*c* of the inner spacer 120. In some embodiments, the gaps 126 are left partially unfilled. For example, a portion of the epitaxial source/drain layers 130B protrudes into the gaps 126 during the epitaxy , process. Accordingly, the inner spacer 127B (or air spacer) occupies a portion of the gaps 126. As a result, the inner spacer 127B may have a thickness along the Y-direction that is less than the thickness 198. In these embodiments, the epitaxial source/drain layers 130B has a sidewall that is partially exposed to the air of the inner spacer 127B (or air spacer). Alternatively, in some embodiments where the inner spacer 127B has been formed from a dielectric material (as illustrated in FIG. 8 above), the epitaxial source/drain layers 130B are formed on (and shares an interface with) the dielectric material of the inner spacer 127B.

Figure 16:
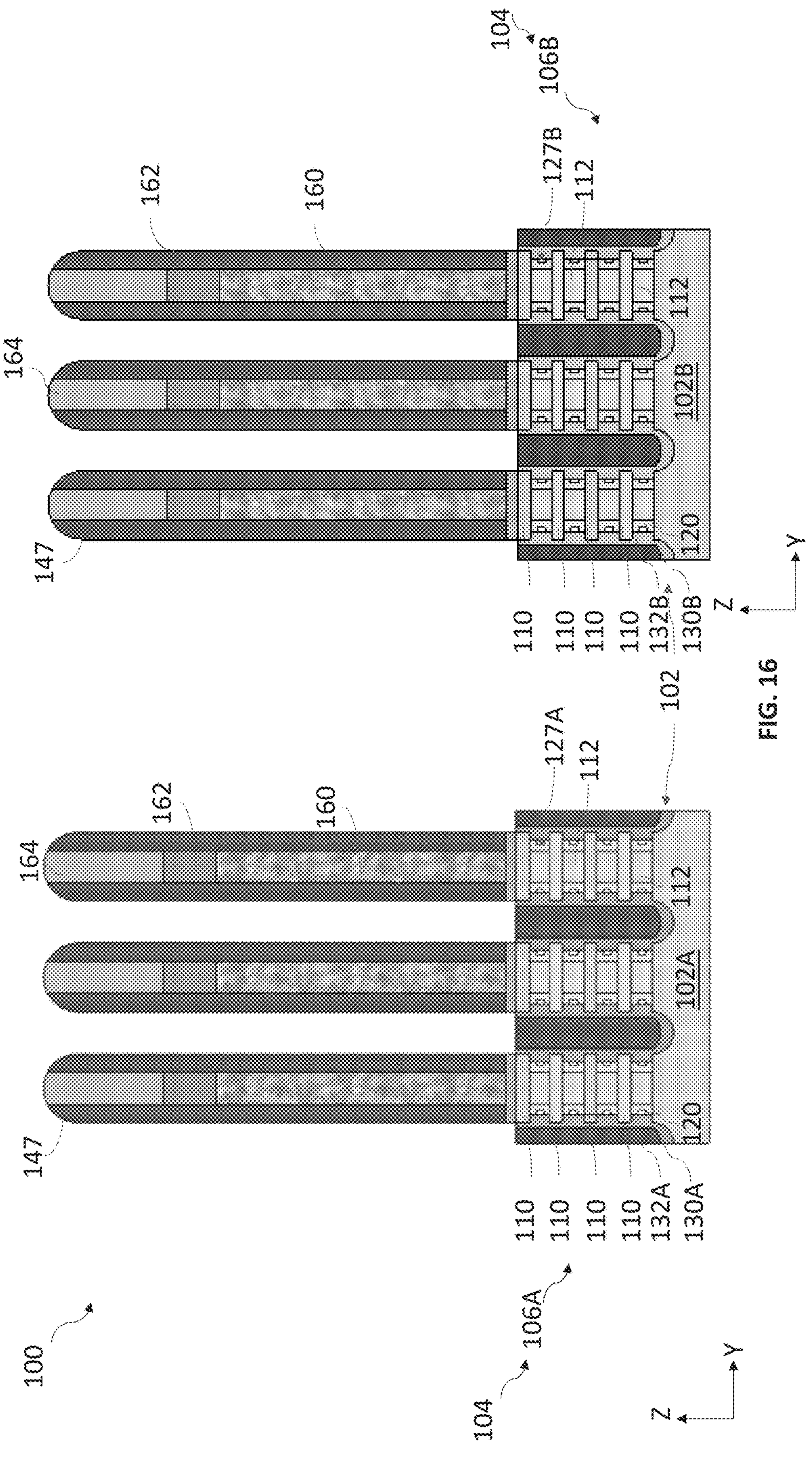

Turning to FIG. 16, hard mask layer 134 over the n-type transistor region is removed by any suitable method, such as a dry etching method, a wet etching method, other suitable etching process, or combinations thereof. Accordingly, the epitaxial source/drain layers 130A and 132A are exposed in the n-type transistor region and the epitaxial source/drain layers 130B and 132B are exposed in the p-type transistor region. Although the description above describes forming features in the n-type transistor region earlier than forming features in the p-type transistor region, the present disclosure also contemplates forming features in the p-type transistor region earlier than forming features in the n-type transistor region.

Figure 17:
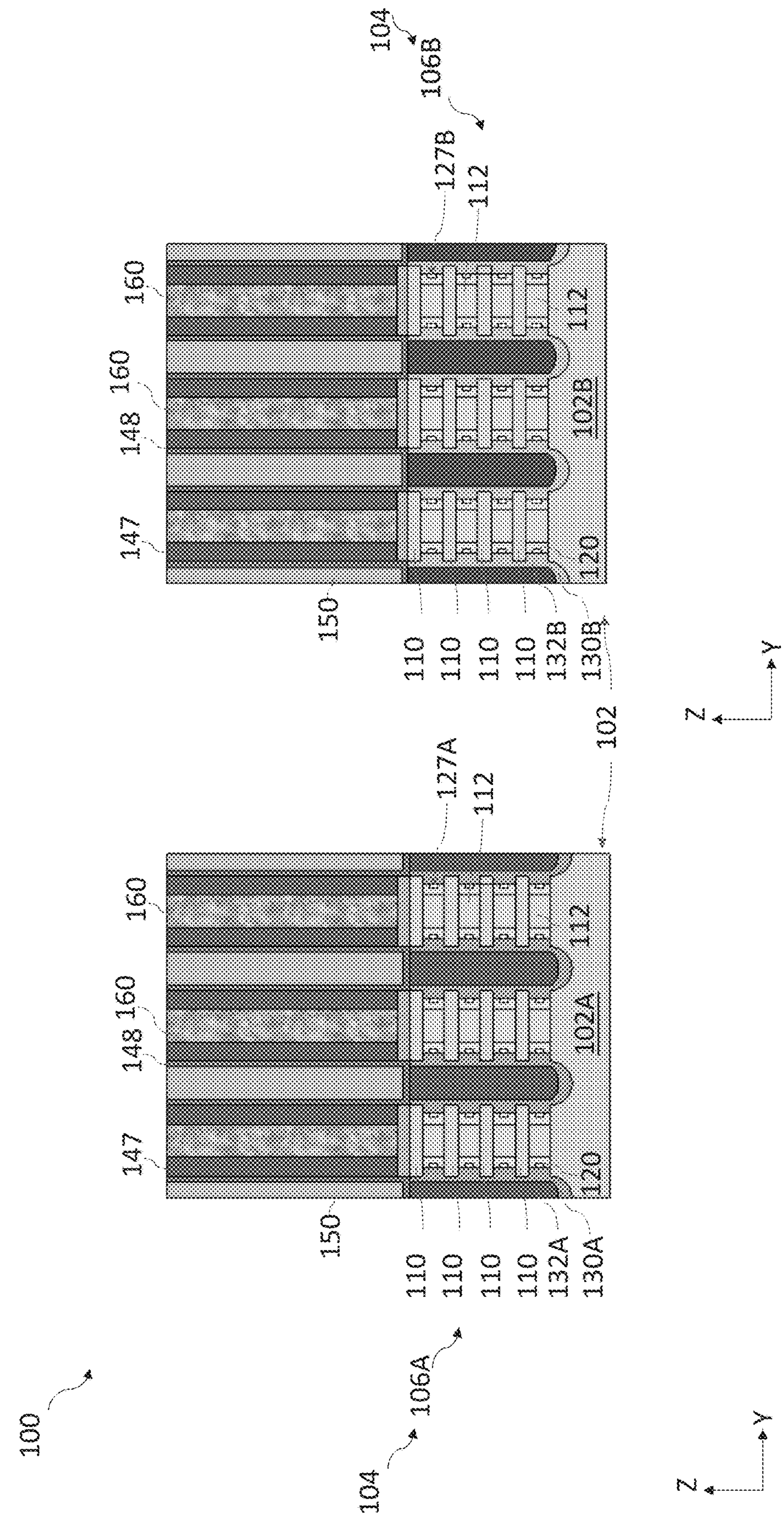

Turning to FIG. 17, an inter-level dielectric (ILD) layer 150 is formed over isolation features, epitaxial source/drain layers 130A, 132A, 130B, 132B, and gate spacers 147, for example, by a deposition process (such as CVD, PVI), ALD, HDPCVD, MOCVD, RPCVD, PECVD, LPCVD, ALCVD, APCVD, plating, other suitable methods, or combinations thereof). ILD layer 150 is disposed between adjacent gate structures (such as between adjacent gate spacers 147). In some embodiments, ILD layer 150 is formed by a flowable CVD (FCVD) process that includes, for example, depositing a flowable material (such as a liquid compound) over device 100 and converting the flowable material to a solid material by a suitable technique, such as thermal annealing and/or ultraviolet radiation treating. ILD layer 150 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parviene, BCB, SiLK (Dow Chemical, Midland, Mich.), polyimide, other low-k dielectric material, or combinations thereof. In the depicted embodiment, ILD layer 150 is a dielectric layer that includes a low-k dielectric material (generally referred to as a low-k dielectric layer). ILD layer 150 can include a multilayer structure having multiple dielectric materials. In some embodiments, a contact etch stop layer (CESL) is disposed between ILD layer 150 and isolation features, epitaxial source/drain layers 130A, 132A, 130B, 132B, and gate spacers 147. The CESL includes a material different than ILD layer 150, such as a dielectric material that is different than the dielectric material of ILD layer 150. For example, where ILD layer 150 includes a low-k dielectric material, the CESL includes silicon and nitrogen, such as silicon nitride or silicon oxynitride. Subsequent to the deposition of ILD layer 150 and/or the CESL, a CMP process and/or other planarization process can be performed until reaching (exposing) a top portion (or top surface) of dummy gate stacks of gate structures 140A, 140B. In some embodiments, the planarization process removes hard mask layers of dummy gate stacks (for example, hard mask layer 162 and hard mask layer 164 in the depicted embodiment) to expose underlying dummy gate electrode layers 160 of dummy gate stacks, such as polysilicon gate electrode layers.

ILD layer 150 may be a portion of a multilayer interconnect (MLI) feature disposed over substrate 102. The MLI feature electrically couples various devices (for example, p-type transistors and/or n-type transistors of device 100, transistors, resistors, capacitors, and/or inductors) and/or components (for example, gate structures and/or epitaxial source/drain features of p-type transistors and/or n-type transistors), such that the various devices and/or components can operate as specified by design requirements of device 100. The MU feature includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature. During operation, the interconnect features are configured to route signals between the devices and/or the components of device 100 and/or distribute signals (for example, clock signals, voltage signals, and/or ground signals) to the devices tend/car the components of device 100.

Figure 18:
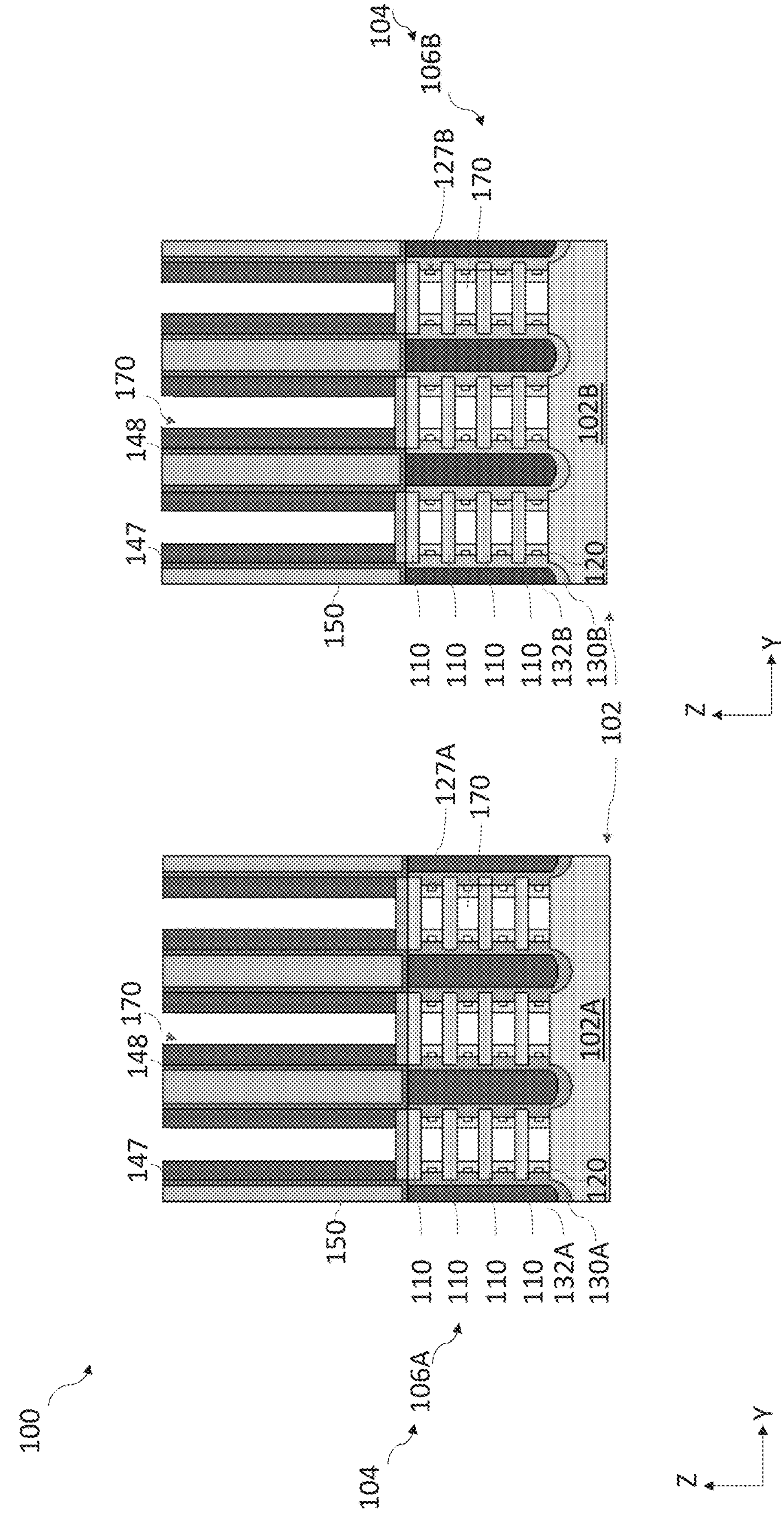

Turning to FIG. 18, dummy gate stacks are removed from gate structures 140A, 140B, thereby exposing semiconductor layer stacks 104 in the n-type transistor region and the p-type transistor region. In the depicted embodiment, an etching process completely removes dummy gate electrode layers 160 to expose semiconductor layers 110 and semiconductor layers 112 in channel regions 114 of the fins 106A, 106B. The etching process is a dry etching process, a wet etching process, other suitable etching process, or combinations thereof. In some embodiments, the etching process is a multi-step etch process. For example, the etching process may alternate etchants to separately remove various layers of dummy gate stacks, such as the dummy gate electrode layers, the dummy gate dielectric layers, and/or the hard mask layers. some embodiments, the etching process is configured to selectively etch dummy gate stacks with minimal (to no) etching of other features of device 100 such as ILD layer 150, gate spacers 147, isolation features, semiconductor layers 110, and semiconductor layers 112. In some embodiments, a lithography process, such as those described herein, is performed to form a patterned mask layer that covers ILD layer 150 and/or gate spacers 147, and the etching process uses the patterned mask layer as an etch mask.

The removal of the dummy gate stack exposes the semiconductor layers 110 and the semiconductor layers 112. For example, sidewall surfaces of the semiconductor layers 110 and 112, for example, extending parallel to the Y-Z plane are exposed by removing the dummy gate stacks. The exposed, remaining portions of the semiconductor layers 112 are thereafter selectively removed from the channel regions 114, thereby forming suspended semiconductor layers 110 in channel regions 114. In the depicted embodiment, an etching process selectively, etches semiconductor layers 112 with minimal (to no) etching of semiconductor layers 110 and, in some embodiments, minimal (to no) etching of gate spacers 147 and/or inner spacers 120. Various etching parameters can be tuned to achieve selective etching of semiconductor layers 112, such as etchant composition, etching temperature, etching solution concentration, etching time, etching pressure, source power, RF bias voltage, RF bias power, etchant flow rate, other suitable etching parameters, or combinations thereof. For example, an etchant is selected for the etching process that etches the material of semiconductor layers 112 (in the depicted embodiment, silicon germanium) at a higher rate than the material of semiconductor layers 110 (in the depicted embodiment, silicon) (i.e., the etchant has a high etch selectivity with respect to the material of semiconductor layers 112). The etching process is a dry etching process, a wet etching process, other suitable etching process, or combinations thereof. In some embodiments, a dry etching process (such as an RIE process) utilizes a fluorine-containing gas (for example, $SF_6$) to selectively etch semiconductor layers 112. In some embodiments, a ratio of the fluorine-containing gas to an oxygen-containing gas (for example, OA an etching temperature, and/or an RF power may be tuned to selectively etch silicon germanium or silicon. In some embodiments, a wet etching process utilizes an etching solution that includes ammonium hydroxide ($NH_4OH$) and water ($H_2O$) to selectively etch semiconductor layers 112. In some embodiments, a chemical vapor phase etching process using hydrochloric acid (HCl) selectively etches semiconductor layers 112.

The removal of the dummy gate stack and the removal of the remaining portions of the semiconductor layers 112 forms gate trenches 170. At least one suspended semiconductor layer 110 is thus exposed by the gate trenches 170. In the depicted embodiment, each of the n-type transistor region and the p-type transistor region includes four suspended semiconductor lavers 110 vertically stacked that will provide four channels through which current will flow between respective epitaxial source/drain features (epitaxial source/drain layers 130A, 132A or epitaxial source/drain layers 130B, 132B) during operation of the transistors. Suspended semiconductor layers 110 are thus interchangeably referred to as channel layers 110 hereinafter. Channel layers 110 are separated from each other and from the substrate 102 by the gate trenches 170.

In some embodiments, each channel layer 110 has nanometer-sized dimensions and can be referred to as a "nanosheet," which generally refers to a channel layer suspended in a manner that will allow a metal gate to physically contact at least two sides of the channel layer, and in nano-sheet-based transistors, will allow the metal gate to physically contact at least four sides of the channel layer (i.e., surround the channel layer). In such embodiments, a vertical stack of suspended channel layers can he referred to as a nanostructure, and the process depicted in FIG. 18 can be referred to as a channel nano-sheet release process. The channel nano-sheet extends in the X-Y plane. In some embodiments, the Y dimension of the channel nano-sheet may be far greater than the X dimension of the channel nano-sheet. Further, the X dimension may also he far greater than the Z dimension. Accordingly, the nano-sheet has a profile that resembles a wire extending along the Y-direction. Accordingly, such a channel nano-sheet is also referred to as a channel nanowire, and the channel nano-sheet release process is also referred to as a channel nanowire release process. In some embodiments, after removing semiconductor layers 112, an etching process is performed to modify a profile of channel layers 110 to achieve desired dimensions and/or desired shapes (e.g., cylindrical-shaped (e.g., nanowire), rectangular-shaped (e.g., nanobar), sheet-shaped (e.g., nano-sheet), etc.). The present disclosure further contemplates embodiments where the channel layers 110 have sub-nanometer dimensions depending on design requirements of device 100.

Figure 19:
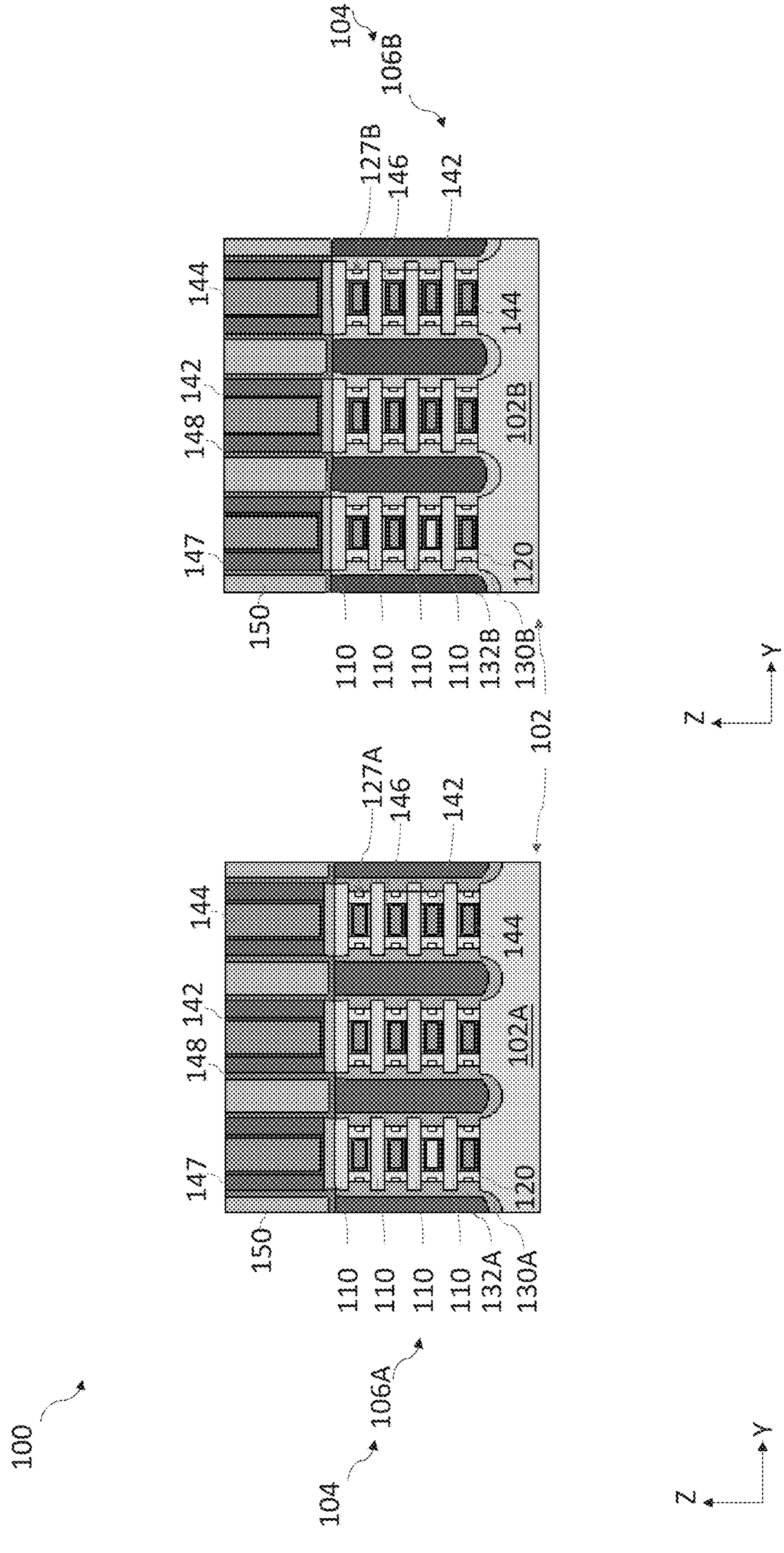

Turning to FIG. 19, a gate dielectric layer is formed over device 100, where the gate dielectric layer partially fills gate trenches 170 and wraps (surrounds) channel layers 110 in the n-type transistor region and the p-type transistor region. In the depicted embodiment, the gate dielectric layer includes an interfacial layer 146 and a high-k dielectric layer 142, where interfacial layer 146 is disposed between the high-k dielectric layer 142 and channel layers 110. In furtherance of the depicted embodiment, interfacial layer 146 and high-k dielectric layer 142 partially fill portions of gate trenches 170 between channel layers 110 and between channel layers 110 and substrate 102. in some embodiments, interfacial layer 146 and/or high-k dielectric layer 142 are also disposed on substrate 102, isolation features, and/or gate spacers 147. Interfacial layer 146 includes a dielectric material, such as $SiO_2$, SiON, other silicon-comprising dielectric material, other suitable dielectric material, or combinations thereof. High-k dielectric layer 142 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba, Sr)$TiO_3$ (BST), $Si_3N_4$, hafnium dioxide-alumina ($HfO_2$-$Al_2O_3$) alloy, other suitable high-k dielectric material, or combinations thereof. High-k dielectric material generally refers to dielectric materials having a high dielectric constant, for example, greater than that of silicon oxide ($k \approx 3.9$). Interfacial layer 146 is formed by any of the processes described herein, such as thermal oxidation, chemical oxidation, ALD, CVD, other suitable process, or combinations thereof. In some embodiments, interfacial layer 146 has a thickness of about 0.5 nm to about 3 nm. High-k dielectric layer 142 is formed by any of the processes described herein, such as ALD, CVD, PVD, oxidation-based deposition process, other suitable process, or combinations thereof. In some embodiments, high-k dielectric layer 142 has a thickness of about 1 nm to about 2 nm.

Moreover, a gate electrode layer 144 is formed on the gate dielectric layer (such as over the high-k dielectric layer 142). In some embodiments, the gate electrode layer 144 may include multiple layers. For example, the gate electrode layer 144 may include a work function layer and a fill metal layer. In some embodiments, the gate electrode layer 144 includes more than one work function layer, such as a p-type work function layer and an n-type work function layer formed over device 100, particularly over high-k dielectric layer 142. P-type work function layer includes any suitable p-type work function material, such as TiN, TaN, TaSN, Ru, Mo, Al, WN, WCN $ZrSi_2$, $MoSi_2$, $TaSi_2$, $NiSi_2$, other p-type work function material, or combinations thereof. N-type work function layer 340 includes any suitable n-type work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. In some embodiments, the n-type, the p--type, or the combinations thereof adjusts work functions of the gate electrode layer 144 such that, the gate electrode layer in the n-type gate portion has an n-type work function, and that the gate electrode layer in the p-type gate portion has a p-type work function. P-type and/or n-type work function layer can be formed using a suitable deposition process, such as ALD, CND, PVD, HDPCVD, MOCVD, RPCVD, PECVD, LPCVD, ALCVD, APCVD, spin coating, plating, other deposition process, or combinations thereof.

The gate electrode layer 144 further includes a metal fill (or bulk) layer formed over device 100, particularly over n-type and/or the p-type work function layers. For example, a CVD process or a PVD process deposits metal fill layer on n-type and/or p-type work function layer, such that metal fill layer fills any remaining portion of gate trenches 170. Metal fill layer includes a suitable conductive material, such as Al, V, and/or Cu. Metal fill layer may additionally or collectively include other metals, metal oxides, metal nitrides, other suitable materials, or combinations thereof. In some implementations, a blocking layer is optionally formed over n-type and/or p-type work function layer before forming metal fill layer, such that metal fill layer is disposed on the blocking layer. The blocking layer includes a material that blocks and/or reduces diffusion between gate layers, such as metal fill layer and n-type and/or p-type work function layers. Alternatively, metal fill layer and/or the blocking layer are formed using another suitable deposition process, such as ALD, CVD, PVD, HDPCVD, MOCVD, RPCVD, PECVD, LPCVD, ALCVD, APCVD, spin coating, plating, other deposition process, or combinations thereof. In some embodiments, a planarization process is performed to remove excess gate materials from device 100. For example, a CMP process is performed until a top surface of ILD layer 150 is reached (exposed), such that a top surface of gate structures 140A, 140B are substantially planar with a top surface of ILD layer 150) after the CMP process. In the depicted embodiment, gate structures 140A, 140B are thus configured with two different metal gates an n-metal gate in the n-type transistor region and a p-metal gate in the p-type transistor region. N-type and p-type metal gates include a gate dielectric (e.g., interfacial layer 146 and high-k dielectric layer 142) and differently configured gate electrodes (e.g., n-type work function layer, p-type work function layer, and/or metal fill layer). Accordingly, device 100 includes n-type transistors having metal gates wrapping respective channel layers 110, such that metal gates are disposed between respective epitaxial source/drain features (for example, epitaxial source/drain layers 130A and/or 132A), and p-type transistors having metal gates wrapping respective channel layers 110, such that metal gates are disposed between respective epitaxial source/drain features (for example, epitaxial source/drain layers 130B and/or 132B).

Figure 20:
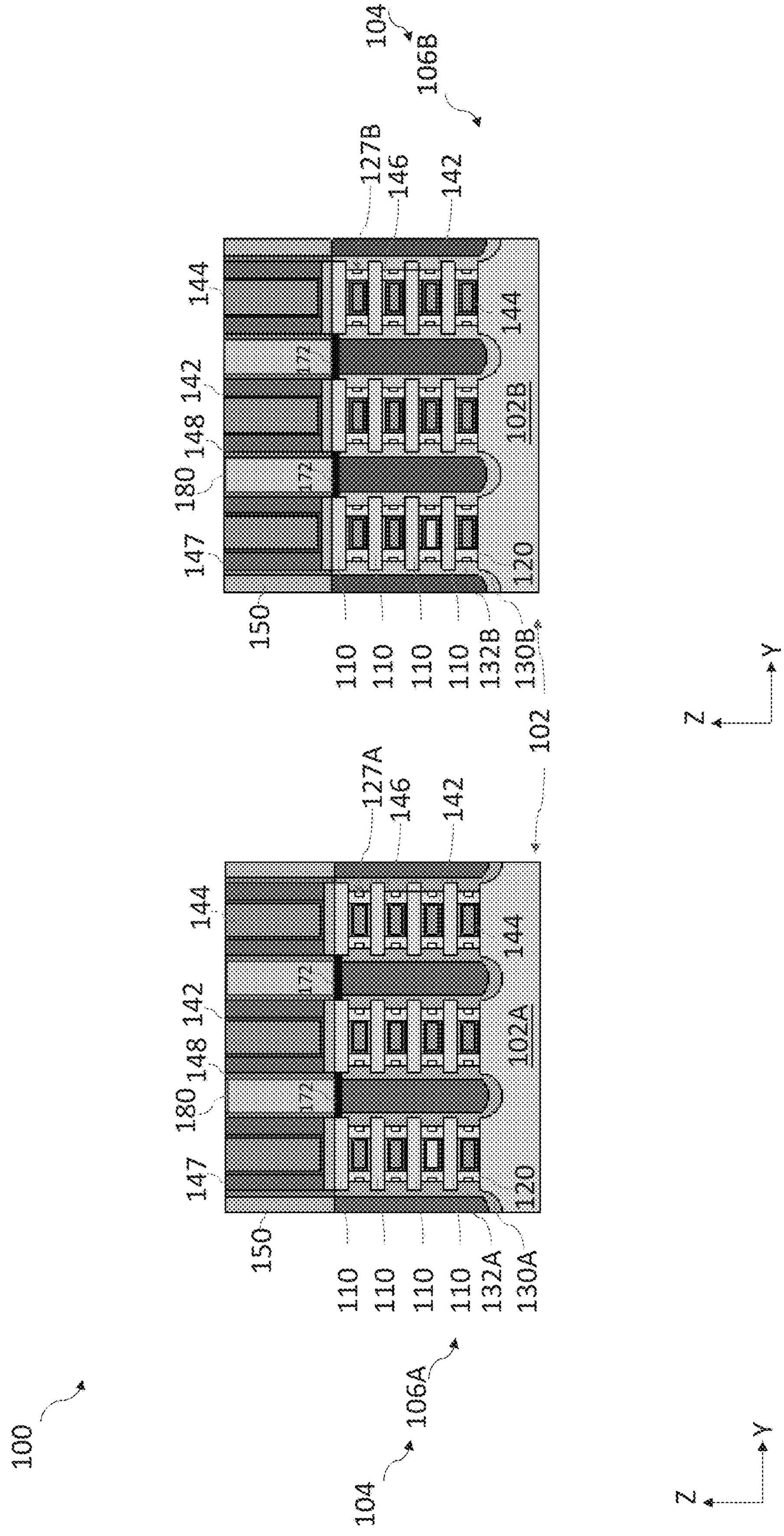

Turning to FIG. 20, various contacts can be formed to facilitate operations of the n-type and the p-type transistors. For example, one or more ILD layers, similar to ILD layer 150, and/or CI SL layers can be formed over substrate 102 (in particular, over ILI) layer 150 and gate structures 140A, 140B). Contacts 180 can then be formed in ILD layer 150 and/or ILD layers disposed over ILD layer 150. Contacts 180 are respectively electrically and/or physically coupled with gate structures 140 and are respectively electrically and/or physically coupled to source/drain regions of the n-type transistors and the p-type transistors (particularly, epitaxial source/drain layers 130A, 132A and/or 130B, 132B). Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. In the depicted embodiments, the contacts 180 are formed in the ILD layer 150 such that the contacts 180 directly interfaces with silicide layers 172. Silicide layers 172 are formed between the contacts 180 and the epitaxial source/drain layers 130A, 132A and/or 130B, 132B to improve electrical connections. Silicide layers 172 may be formed using any suitable methods. For example, a metal layer is formed over the epitaxial source/drain layers 130A, 132A and/or 130B, 132B. Subsequently, an annealing treatment is performed on the metal layer to convert the metal layer into the silicide layer 172. In some embodiments, the composition of the ambient gas, the composition of the purge gas, the flow rates of the ambient gas, the flow rate of the purge gas, the gas pressure in the chamber, as well as the temperature ramp-up rate, the temperature hold time, and the temperature range may all be adjusted in order to facilitate the chemical reaction that forms the silicide layer over the epitaxial source/drain layers 130A, 132A, and/or 130B, 132B. Accordingly, the heating treatment induces a chemical reaction between the epitaxial source/drain layers 130A, 132A, and/or 130B, 132B and the metal layer. In some embodiments, the silicide layer 172 includes nickel silicide, cobalt silicide, tungsten silicide, tantalum silicide, titanium silicide, platinum silicide, erbium silicide, palladium silicide, other suitable silicide materials, or combinations thereof. In some implementations, ILD layers disposed over ILD layer 150 and the contacts (for example, extending through ILD layer 150 and/or the other ILD layers) are a portion of the MU feature described above. Fabrication can proceed to complete the fabrication of device 100.

Figure 21A:
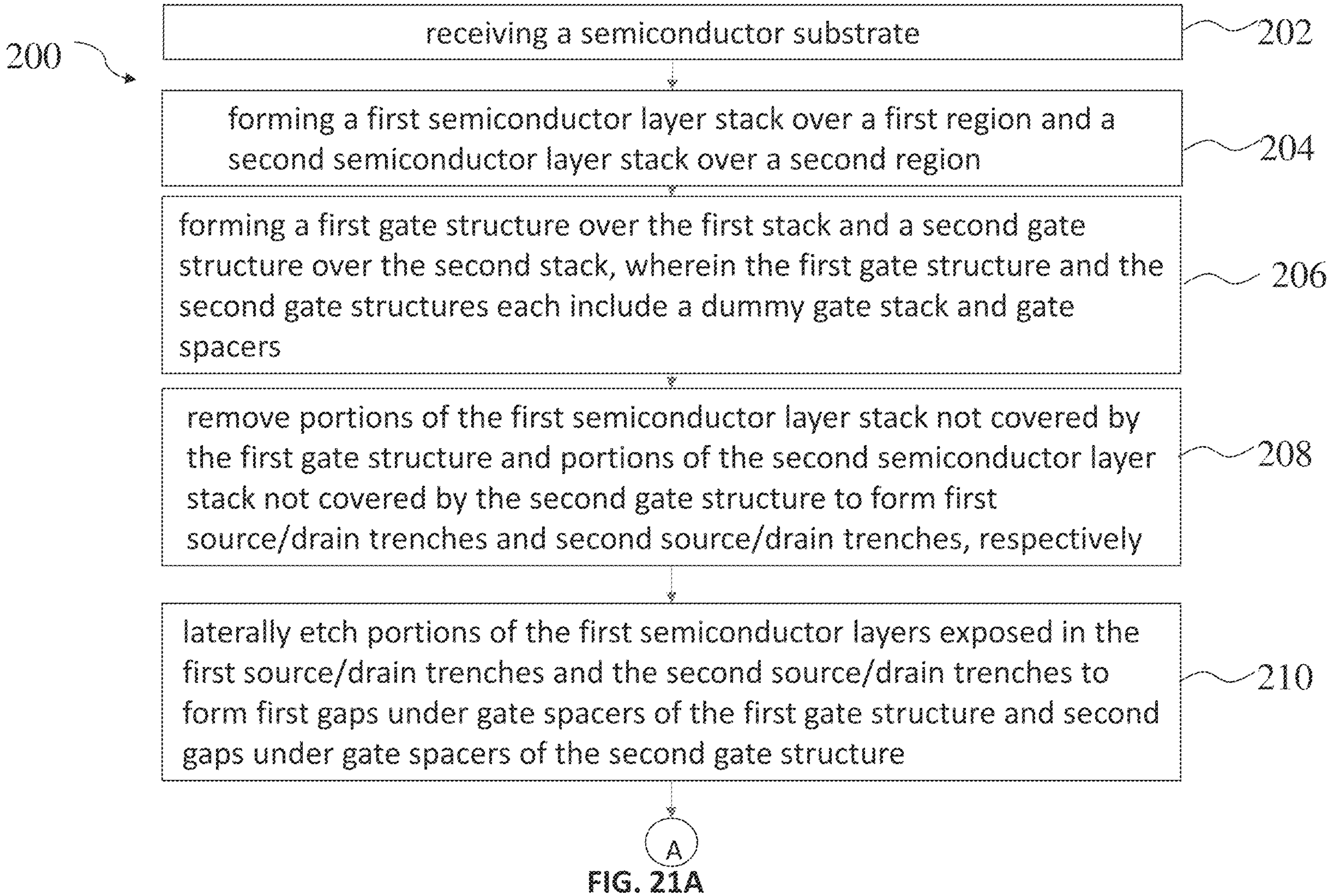
FIGS. 21A-21B are a flow chart of a method for fabricating a nano-sheet-based device according to various aspects of the present disclosure.
Figure 21B:
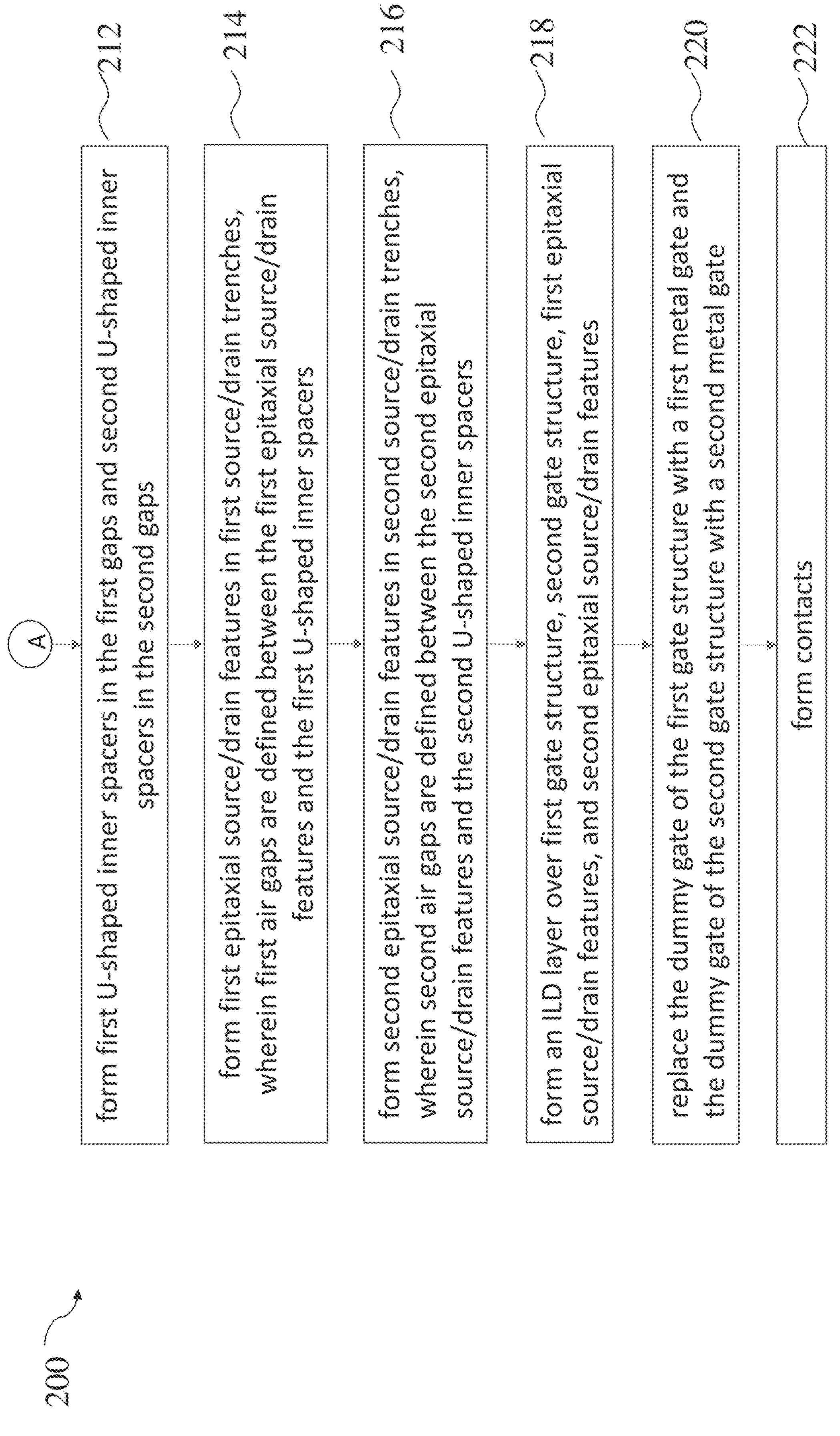

FIGS. 21A and FIG. 21B illustrate a flow chart of a method 200 for fabricating a nano-sheet-based device, such as nano-sheet-based device 100, according to various aspects of the present disclosure. In some embodiments, method 200 fabricates a device that includes p-type nano-sheet-based transistors and n-type nano-sheet-based transistors. At block 202, a semiconductor substrate is received. At block 204, a first semiconductor layer stack in a first region (for example, an n-type transistor region) and a second semiconductor layer stack in a second region (for example, a p-type transistor region) are formed over a substrate. The first semiconductor layer stack and the second semiconductor layer stack each include first semiconductor layers and second semiconductor layers stacked vertically in an alternating configuration. At block 206, a first gate structure is formed over the first semiconductor layer stack and a second gate structure is formed over the second semiconductor layer stack. The first and the second gate structures each include a dummy gate stack and gate spacers. In some embodiments, the first gate structure and the second gate structure collectively form a single gate structure extending over the first and the second semiconductor layer stacks. This is illustrated in FIG. 1. At blocks 208, portions of the first semiconductor layer stack not covered by the first gate structure and portions of the second semiconductor layer stack not covered by the second gate structure are removed to form first source/drain trenches and second source/drain trenches, respectively. This is illustrated in FIG. 2. At blocks 210, method 200 includes removing portions of the first semiconductor layers exposed in the first source/drain trenches and the second source/drain trenches to form gaps under gate spacers of the first gate structure and gaps under gate spacers of the second gate structure. This step may be referred to as lateral etching or lateral recess. The gaps are defined between the second semiconductor layers. This is illustrated in FIG. 3. At block 212 first U-shaped inner spacers are formed in the first gaps and second U-shaped inner spacers are formed in the second gaps. This is described in FIGS. 4 and 5, and also further described below. At block 214, a first epitaxial source/drain features are formed in the first source/drain trenches. This is illustrated in FIGS. 9-11. At block 216, second epitaxial source/drain features are formed in the second source/drain trenches. The second air gaps are defined between the second epitaxial source/drain features and the second U-shaped inner spacers. This is illustrated in FIGS. 12-16. At block 218, an ILD layer is formed over first gate structure, second gate structure, first epitaxial source/drain features, and second epitaxial source/drain features. This is illustrated in FIG. 17. At block 220, the dummy gate stacks of the first gate structure are replaced with a first metal gate and the dummy gate stacks of the second gate structure are replaced with a second metal gate. The first metal gate and second metal gate may each include a gate dielectric and a gate electrode. This is illustrated in FIGS. 18-19. At block 222, contacts are formed. For example, source/drain contacts may be formed on the first and the second epitaxial source/drain features and/or gate contacts may be formed on the metal gate. Additional steps may be added before, between, or after steps described here. Further, steps may be eliminated or replaced without departing from the spirit of the present disclosure.

Figure 22A:
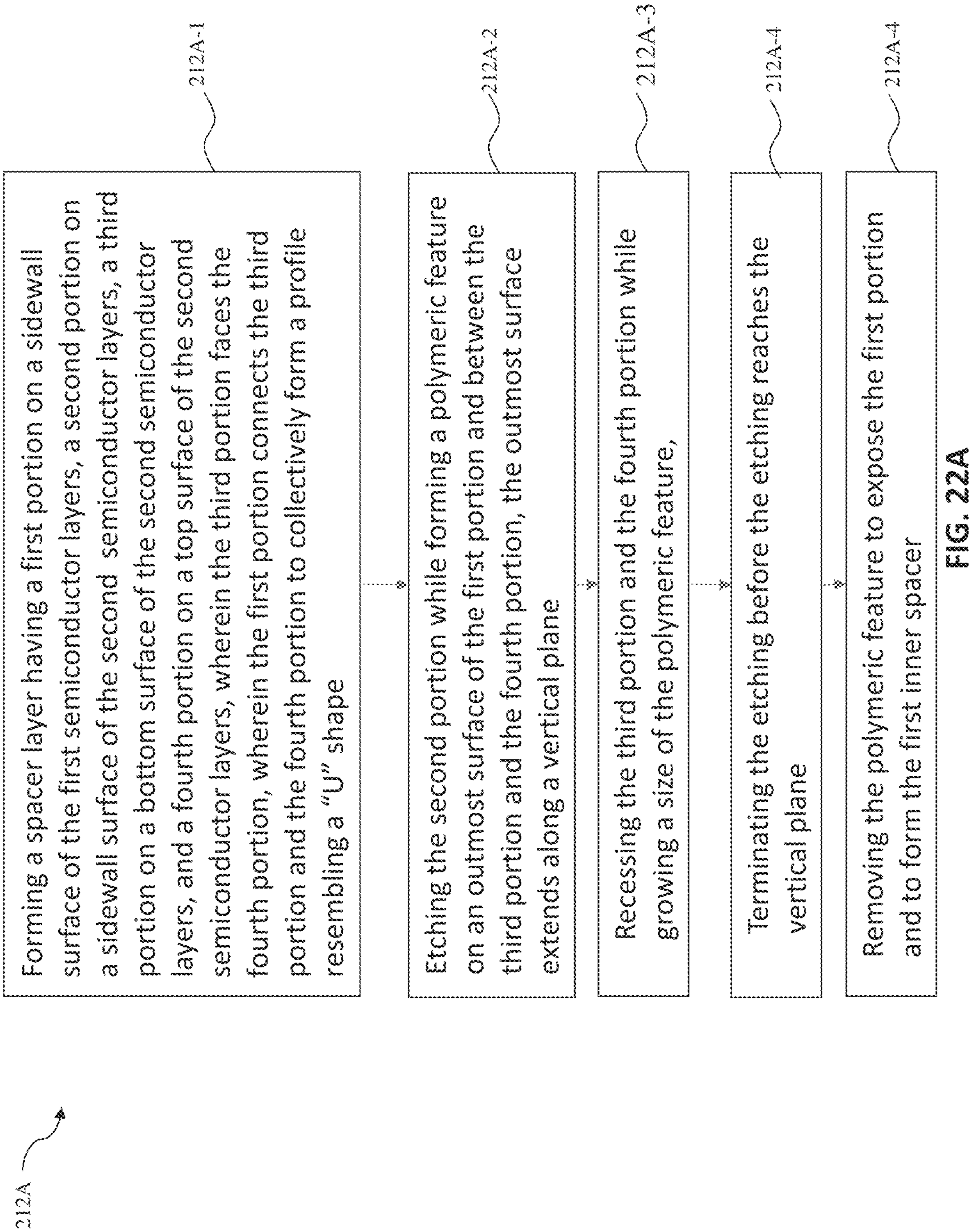
FIGS. 22A and 22B are flow charts illustrating details of a portion of a method (such as the block 212 of FIG. 21B) for fabricating a nano-sheet-based device according to various aspects of the present disclosure.

In some embodiments, the U-shaped inner spacers of block 212 may be formed according to the flowchart illustrated in FIG. 22A. At block 212A-1, a spacer layer is formed on exposed surfaces of the device 100. The spacer layer is configured to have a first portion on a sidewall surface of the first semiconductor layers, a second portion on a sidewall surface of the second semiconductor layers, a third portion on a bottom surface of the second semiconductor layers, and a fourth portion on a top surface of the second semiconductor layers. Accordingly, the third portion faces the fourth portion. The spacer layer is configured to have the first portion connecting the third portion and the fourth portion to collectively form a profile resembling a "U" shape. At block 212A-2, an etching process is conducted to etching the second portion of the spacer layer while forming a polymeric feature on an outmost surface of the first portion and between the third and the fourth portions. The size of the polymeric feature increases as the size of the second portion is reduced. The entirety of the second portion is removed. At block 212A-3, the etching process continues, and proceeds to recess the third portion and the fourth portion. The etching process further forms additional polymeric material from the interaction between the etching chemical and the materials of the spacer layer. Accordingly, the size of the polymeric feature increases. At block 212A-4, the etching process is terminated before the etching process reaches the vertical plane along which the outmost surface of the first portion extends. Accordingly, the "U" shape profile is maintained, Moreover, at block 212A-5, the polymeric feature is removed by any suitable methods to expose the first portion. At this stage, the etched third portion, the first portion, and the etched fourth portion collectively form the first inner spacer.

Figure 22B:
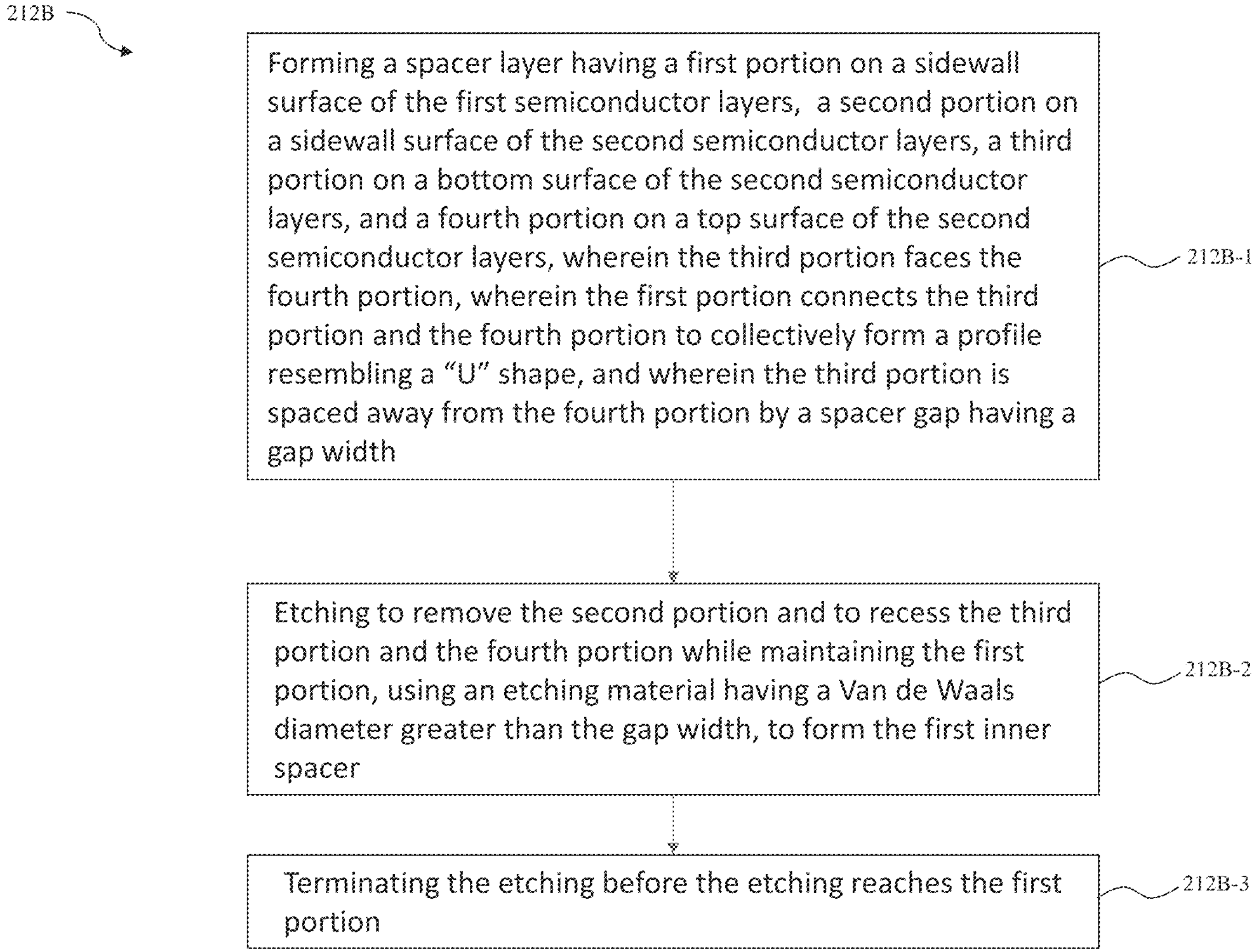

In some embodiments, the U-shaped inner spacers of block 212 may alternatively be formed according to the flowchart illustrated in FIG. 22B. At block 212B-1, a spacer layer is formed on exposed surfaces of the device 100. The spacer layer is configured to have a first portion on a sidewall surface of the first semiconductor layers, a second portion on a sidewall surface of the second semiconductor layers, a third portion on a bottom surface of the second semiconductor layers, and a fourth portion on a top surface of the second semiconductor layers. Accordingly, the third portion faces the fourth portion. The spacer layer is configured to have the first portion connecting the third portion and the fourth portion to collectively form a profile resembling a "U" shape. Moreover, the third portion is configured to be spaced away from the fourth portion by a spacer gap that has a gap width. At block 212B-2, an etching process is conducted to remove the second portion and to recess the third portion and the fourth portion using an etching chemical. The etching chemical is selected based on its molecular size, such that the Van der Waals diameter of the etching chemical is greater than the gap width. Because the etching chemicals have a molecular size that exceeds the gap width, the etching chemicals cannot diffuse into the spacer gap. At block 212B-3, the etching operation is terminated before the etching chemical reaches the first portion, such that a U-shaped first inner spacer is achieved.

In some embodiments, the forming of the first and/or the second epitaxial source/drain features may enclose an unfilled air gap between two prongs of the U-shaped inner spacers, thereby forming (or defining) air-based inner spacers (or air spacers). Alternatively, before the forming of the first and/or the second epitaxial source/drain features, a dielectric material may be deposited between the two prongs of the U-shaped inner spacers, thereby forming dielectric material-based inner spacers. Subsequently, the first and/or the second epitaxial source/drain features are formed on sidewall surfaces of the dielectric material-based inner spacers.

As can be seen from the descriptions above, the present disclosure contemplates various configurations of inner spacers structures that may be the same or different in the p-type transistor region and in the n-type transistor region. In the depicted embodiments of FIGS. 1-5 and 9-20, both transistor regions may include a U-shaped inner spacer and an air spacer between the two prongs of the U. In another embodiment, both transistor regions may include a U-shaped inner spacer and a dielectric material-based inner spacer between the two prongs of the U (such as that depicted in FIG. 8). The two dielectric material-based spacer include the same material. In yet another embodiment, one transistor region may include a U-shaped inner spacer and an air spacer between the two prongs of the U, while the other transistor region may include a U-shaped inner spacer and a dielectric material-based inner spacer between the two prongs of the U. For example, the dielectric material-based inner spacer may be formed following the stage associated with FIG. 10 and before the stage associated with FIG. 11, while the air spacer may be formed as depicted in FIG. 15, or vice versa. In still another embodiment, both transistor regions may include a U-shaped inner spacer and a dielectric material-based inner spacer between the two prongs of the U, however, the two dielectric material-based inner spacers include different materials. For example, a first inner spacer of a first dielectric material may he formed following the stage associated with FIG. 10 and before the stage associated with FIG. 11, while a second inner spacer of a second dielectric material may be formed following the stage associated with FIG. 14 and before the stage associated with FIG. 15. The first and the second material may be different from each other.

The present disclosure provides for many different embodiments. One general aspect includes a semiconductor device. The semiconductor device includes a substrate, a first source/drain feature and a second source/drain feature over the substrate, a first semiconductor layer and a second semiconductor layer between the first source/drain feature and the second source/drain feature, and a gate between the first source/drain feature and the second source/drain feature. A portion of the gate is further between the first semiconductor layer and the second semiconductor layer. Moreover, the semiconductor device includes a first inner spacer and a second inner spacer. The first inner spacer is between the first semiconductor layer and the second semiconductor layer and further between the portion of the gate and a portion of the first source/drain feature, The first inner spacer has a U-shaped profile. Furthermore, the portion of the first source/drain feature is between the first semiconductor layer and the second semiconductor layer. Additionally, the second inner spacer is between the first inner spacer and the portion of the first source/drain feature.

In some embodiments, the first inner spacer includes a first portion on a sidewall surface of the portion of the gate, a second portion on a bottom surface of the first semiconductor layer, and a third portion on a top surface of the second semiconductor layer. The first portion has a first surface opposing the sidewall surface of the portion of the gate. The second portion has a second surface opposing the bottom surface of the first semiconductor layer. And the third portion has a third surface opposing the top surface of the second semiconductor layer. Moreover, a fourth surface of the portion of the first source/drain feature is spaced away from the first surface of the first portion. Furthermore, the second inner spacer is defined by the first surface of the first portion, the second surface of the second portion, the third surface of the third portion, and the fourth surface of the portion of the first source/drain feature. In some embodiments, the second inner spacer is an air gap. In some embodiments, the second inner spacer includes an oxide material. In some embodiments, the second inner spacer includes a nitride material. In some embodiments, the second inner spacer has a rectangle profile. In some embodiments, the first inner spacer has a first thickness along a gate length direction. Moreover, the second inner spacer has a second thickness along the gate length direction, and the second thickness is less than the first thickness. In some embodiments, the portion of the first source/drain feature includes a sidewall. A first section of the sidewall interfaces with the first inner spacer, and a second section of the sidewall interfaces with the second inner spacer. In some embodiments, the second inner spacer has a first dimension of less than 3 nm along a first direction perpendicular to a top surface of the second semiconductor layer, and a second dimension of about 2 nm to 6 nm along a second direction perpendicular to the first direction.

One general aspect includes a method. The method includes receiving a semiconductor structure. The semiconductor structure has a first semiconductor layer over a substrate, a second semiconductor layer over the first semiconductor layer, and a third semiconductor layer over the second semiconductor layer. Moreover, the first semiconductor layer and the third semiconductor layer include a first semiconductor material, the second semiconductor layer includes a second semiconductor material, where the second semiconductor material is different than the first semiconductor material. The method also includes forming a U-shaped spacer layer between the first semiconductor layer and the third semiconductor layer. The U-shaped spacer layer has a first portion that covers a top surface of the first semiconductor layer, a second portion that covers a sidewall surface of the second semiconductor layer, and a third portion that covers a bottom surface of the third semiconductor layer. Moreover, a gap is defined by the first portion, the second portion, and the third portion of the U-shaped spacer layer. The method further includes etching the first portion and the third portion of the U-shaped spacer layer to expose a portion of the top surface of the first semiconductor layer and a portion of the bottom surface of the third semiconductor layer. The method additionally includes forming an epitaxial source/drain feature between the exposed portion of the top surface of the first semiconductor layer and the exposed portion of the bottom surface of the third semiconductor layer. The epitaxial source/drain feature is separated from the second portion of the U-shaped spacer layer by the gap.

In some embodiments, the U-shaped spacer layer is a first U-shaped spacer layer. The etching of the first portion and the third portion forms a second U-shaped spacer layer. The second U-shaped spacer layer is defined by the etched first portion, the etched third portion, and the second portion. In some embodiments, the forming of the U-shaped spacer layer includes performing a conformal deposition process. In some embodiments, the etching of the first portion and the third portion of the U-shaped spacer layer forms a polymeric feature in the gap. In some embodiments, the forming of the polymeric feature includes tuning a flow rate and a composition of an etching chemical to form the polymeric feature. In some embodiments, the etching chemical includes fluorine, the U-shaped spacer layer includes silicon, and the polymeric feature includes silicon and fluorine. In some embodiments, a width of the gap is defined between the first portion and the third portion of the U-shaped spacer layer and the etching of the first portion and the third portion of the U-shaped spacer layer uses an etching chemical having a Van der-de Waals radius greater than the width of the gap. In some embodiments, the gap width is less than about 3 nm. In some embodiments, the method further includes filling the gap with a dielectric material before forming the epitaxial source/drain feature.

One general aspect includes a method. The method includes receiving a semiconductor structure. The semiconductor structure has a first suspended semiconductor layer and a second suspended semiconductor layer stacked over a substrate along a first direction perpendicular to a top surface of the substrate. The method also includes forming a conformal spacer layer. The conformal spacer layer has a first portion and a second portion. The first portion has a uniform thickness along the first direction and the second portion has the uniform thickness along a second direction perpendicular to the first direction. The first portion further has a first lateral dimension along the second direction. The method further includes laterally recessing the first portion along the second direction, thereby forming a recessed first portion having a second lateral dimension that is less than the first lateral dimension and greater than the uniform thickness. The method additionally includes forming an epitaxial source drain feature between the first suspended semiconductor layer and the second suspended semiconductor layer. The epitaxial source/drain feature also interfaces with the first portion and is spaced away from the second portion.

In some embodiments, the laterally recessing of the first portion forms a byproduct on a sidewall of the second portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:

a first semiconductor layer and a second semiconductor layer;

a gate that is disposed between a central portion of the first semiconductor layer and a central portion of the second semiconductor layer, wherein the gate wraps the central portion of the first semiconductor layer and the central portion of the second semiconductor layer;

a first epitaxial source/drain disposed between a first end portion of the first semiconductor layer and a first end portion of the second semiconductor layer;

a second epitaxial source/drain disposed between a second end portion of the first semiconductor layer and a second end portion of the second semiconductor layer;

a first inner spacer structure disposed between the first end portion of the first semiconductor layer and the first end portion of the second semiconductor layer, wherein the first inner spacer structure is between the first epitaxial source/drain and the gate;

a second inner spacer structure disposed between the second end portion of the first semiconductor layer and the second end portion of the second semiconductor layer, wherein the second inner spacer structure is between the second epitaxial source/drain and the gate;

wherein each of the first inner spacer structure and the second inner spacer structure has:

an air gap, and a dielectric layer that wraps the air gap; and wherein the each of the first epitaxial source/drain and the second epitaxial source/drain includes:

a first epitaxial layer wrapped by a second epitaxial layer, wherein the first epitaxial layer is different from the second epitaxial layer, and further wherein the second epitaxial layer but not the first epitaxial layer is disposed between the first end portion of the first semiconductor layer and the first end portion of the second semiconductor layer or between the second end portion of the first semiconductor layer and the second end portion of the second semiconductor layer, and wherein the air gap and the dielectric layer interface with the second epitaxial layer of the first epitaxial source/drain or the second epitaxial source/drain.

2. The device of claim 1, wherein the first epitaxial layer and the second epitaxial layer extend below a bottommost portion of the gate.

3. The device of claim 1, wherein each of the first inner spacer structure and the second inner spacer structure has:

an upper portion formed by a first portion of the dielectric layer;

a lower portion formed by a second portion of the dielectric layer;

a middle portion formed by a third portion of the dielectric layer and the air gap;

wherein both the second epitaxial layer of the first epitaxial source/drain and the upper portion abut a bottom surface of the first end portion of the first semiconductor layer; and wherein both the second epitaxial layer of the first epitaxial source/drain and the lower portion abut a top surface of the first end portion of the second semiconductor layer.

4. The device of claim 3, wherein:

each of the first inner spacer structure and the second inner spacer structure has a total thickness between the gate and the first epitaxial source/drain or the second epitaxial source/drain;

each of the first portion of the dielectric layer forming the upper portion and the second portion of the dielectric layer forming the lower portion has a first thickness, wherein the first thickness is equal to the total thickness; and the third portion of the dielectric layer forming the middle portion has a second thickness, the air gap forming the middle portion has a third thickness, and a sum of the second thickness and the third thickness is equal to the total thickness.

5. The device of claim 1, wherein each of the first inner spacer structure and the second inner spacer structure has:

a total length between the first semiconductor layer and the second semiconductor layer;

a gate interfacing portion formed by a first portion of the dielectric layer having a first length that is equal to the total length; and an epitaxial source/drain interfacing portion formed by the air gap disposed between a second portion of the dielectric layer and a third portion of the dielectric layer, wherein:

the air gap has a second length, the second portion of the dielectric layer has a third length, and the third portion of the dielectric layer has a fourth length, and a sum of the second length, the third length, and the fourth length is equal to the total length.

6. The device of claim 5, wherein the second length is less than about 3 nm.

7. A device comprising:

a first semiconductor layer and a second semiconductor layer;

a gate structure having a gate disposed between gate spacers, wherein the gate wraps the first semiconductor layer and the second semiconductor layer, and a portion of the gate is disposed between the first semiconductor layer and the second semiconductor layer;

an epitaxial source/drain that wraps an end of the first semiconductor layer and an end of the second semiconductor layer, wherein:

the end of the first semiconductor layer includes a first top surface extending along a first direction, a first bottom surface extending along the first direction, and a first sidewall surface that extends along a second direction from the first top surface to the first bottom surface, the end of the second semiconductor layer includes a second top surface extending along the first direction, a second bottom surface extending along the first direction, and a second sidewall surface that extends along the second direction from the second top surface to the second bottom surface, wherein the second direction is orthogonal to the first direction, and the epitaxial source/drain has a lateral extending portion that extends under one of the gate spacers, wherein the lateral extending portion of the epitaxial source/drain is disposed between and extends over the first bottom surface of the end of the first semiconductor layer and the second top surface of the end of the second semiconductor layer; and a dielectric structure disposed between the gate and the lateral extending portion of the epitaxial source/drain, wherein the dielectric structure is disposed between the first semiconductor layer and the second semiconductor layer and the dielectric structure includes a U-shaped dielectric layer and an air gap, wherein the air gap is disposed between the U-shaped dielectric layer and the lateral extending portion of the epitaxial source/drain; and wherein:

the first bottom surface of the end of the first semiconductor layer extends a first length along the first direction from a gate sidewall of the portion of the gate disposed between the first semiconductor layer and the second semiconductor layer to the first sidewall surface of the end of the first semiconductor layer, the second top surface of the end of the second semiconductor layer extends the first length along the first direction from the gate sidewall of the portion of the gate disposed between the first semiconductor layer and the second semiconductor layer to the second sidewall surface of the end of the second semiconductor layer, and the laterally extending portion of the epitaxial source/drain has a second length along the first direction, the dielectric structure has a third length along the first direction, and a sum of the second length and the third length equals the first length.

8. The device of claim 7, wherein the dielectric structure and the lateral extending portion of the epitaxial source/drain are disposed underneath the one of the gate spacers.

9. The device of claim 7, wherein:

the U-shaped dielectric layer forms a top of the dielectric structure that is disposed along the first semiconductor layer and a bottom of the dielectric structure that is disposed along the second semiconductor layer; and the U-shaped dielectric layer and the air gap form a middle of the dielectric structure.

10. The device of claim 7, wherein the air gap has a rectangular shape.

11. The device of claim 7, wherein:

a spacing is between the first semiconductor layer and the second semiconductor layer along the a second direction; and a length of the air gap along the second direction is less than about 3 nm.

12. A semiconductor device, comprising:

a substrate;

a first source/drain feature and a second source/drain feature over the substrate;

a first semiconductor layer and a second semiconductor layer extending lengthwise along a first direction between the first source/drain feature and the second source/drain feature;

a gate between the first source/drain feature and the second source/drain feature, wherein the gate extends lengthwise along a second direction that is orthogonal to the first direction, a portion of the gate is between the first semiconductor layer and the second semiconductor layer, and top surfaces and bottom surfaces of the first semiconductor layer and the second semiconductor layer extend a lateral distance along the first direction beyond sidewalls of the portion of the gate; and a first inner spacer and a second inner spacer, wherein:

the first inner spacer is between the first semiconductor layer and the second semiconductor layer along a third direction that is orthogonal to the first direction and the second direction, the first inner spacer is between the portion of the gate and a portion of the first source/drain feature along the first direction, wherein the portion of the first source/drain feature is between the first semiconductor layer and the second semiconductor layer along the third direction and a maximum thickness of the first inner spacer along the first direction is less than the lateral distance, the first inner spacer is formed of a single dielectric layer having a U-shaped profile, and the second inner spacer is between the first inner spacer and the portion of the first source/drain feature, the second inner spacer is formed of air, and the second inner spacer has a gap width defined by the U-shaped profile of the single dielectric layer, wherein the gap width is less than a Van der Waal radius of an etching chemical used to provide the first inner spacer with the maximum thickness along the first direction that is less than the lateral distance.

13. The semiconductor device of claim 12, wherein the first inner spacer includes a first portion on one of the sidewalls of the portion of the gate, a second portion that partially covers the bottom surface of the first semiconductor layer, and a third portion that partially covers the top surface of the second semiconductor layer, wherein the first portion has a first surface opposing the one of the sidewalls of the portion of the gate, the second portion has a second surface opposing the bottom surface of the first semiconductor layer, and the third portion has a third surface opposing the top surface of the second semiconductor layer, wherein a fourth surface of the portion of the first source/drain feature is spaced away from the first surface of the first portion, and wherein the second inner spacer is defined by the first surface of the first portion, the second surface of the second portion, the third surface of the third portion, and the fourth surface of the portion of the first source/drain feature.

14. The semiconductor device of claim 12, wherein a thickness of the single dielectric layer is about 2 nm to about 4 nm, the Van der Waal radius is greater than 3 nm, and the gap width is less than 3 nm.

15. The semiconductor device of claim 12, wherein the single dielectric layer includes an oxide material.

16. The semiconductor device of claim 12, wherein the single dielectric layer includes a nitride material.

17. The semiconductor device of claim 12, wherein the second inner spacer has a rectangle profile.

18. The semiconductor device of claim 12, wherein the single dielectric layer has a uniform thickness.

19. The semiconductor device of claim 12, wherein the portion of the first source/drain feature includes a sidewall, a first section of the sidewall interfaces with the first inner spacer, and a second section of the sidewall interfaces with the second inner spacer.

20. The semiconductor device of claim 12, wherein the etching chemical is fluorine.

* * * * *